(12) United States Patent
Wilson et al.

(10) Patent No.: US 12,074,123 B2
(45) Date of Patent: Aug. 27, 2024

(54) MULTI LEVEL RADIO FREQUENCY (RF) INTEGRATED CIRCUIT COMPONENTS INCLUDING PASSIVE DEVICES

(71) Applicant: MACOM Technology Solutions Holdings, Inc., Lowell, MA (US)

(72) Inventors: Richard Wilson, Morgan Hill, CA (US); Madhu Chidurala, Los Altos, CA (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 163 days.

(21) Appl. No.: 17/031,745

(22) Filed: Sep. 24, 2020

(65) Prior Publication Data

US 2021/0313283 A1   Oct. 7, 2021

Related U.S. Application Data

(60) Provisional application No. 63/004,758, filed on Apr. 3, 2020.

(51) Int. Cl.
*H01L 23/66* (2006.01)
*H01L 23/00* (2006.01)
(Continued)

(52) U.S. Cl.
CPC ........ *H01L 23/66* (2013.01); *H01L 23/49811* (2013.01); *H01L 23/49827* (2013.01);
(Continued)

(58) Field of Classification Search
CPC .............. H01L 23/66; H01L 23/49811; H01L 23/49827; H01L 24/08; H01L 24/48;
(Continued)

(56) References Cited

U.S. PATENT DOCUMENTS 3,969,745 A    7/1976  Blocker
6,586,833 B2   7/2003  Baliga
(Continued)

FOREIGN PATENT DOCUMENTS

EP    1693891 B1    7/2019
EP    3783663 A1    2/2021
(Continued)

OTHER PUBLICATIONS

Notification of Transmittal of the International Search Report and the Written Opinion of the International Searching Authority, or the Declaration, in corresponding PCT Application No. PCT/US2021/024623 (dated Jul. 16, 2021).
(Continued)

*Primary Examiner* — Elias Ullah
(74) *Attorney, Agent, or Firm* — Myers Bigel, P.A.

(57) ABSTRACT

A multi-level radio frequency (RF) integrated circuit component includes an upper level including at least one inductor, and a lower level including at least one conductive element that provides electrical connection to the at least one inductor. The lower level separates the at least one inductor from a lower surface that is configured to be attached to a conductive pad. Related integrated circuit device packages are also discussed.

43 Claims, 20 Drawing Sheets

(51) Int. Cl.
*H01L 23/498* (2006.01)
*H01L 25/18* (2023.01)
(52) U.S. Cl.
CPC .............. *H01L 24/08* (2013.01); *H01L 24/48* (2013.01); *H01L 25/18* (2013.01); *H01L 2223/6672* (2013.01); *H01L 2224/08145* (2013.01); *H01L 2224/08225* (2013.01); *H01L 2224/16145* (2013.01); *H01L 2224/48137* (2013.01); *H01L 2224/48157* (2013.01)
(58) Field of Classification Search
CPC .............. H01L 25/18; H01L 2223/6672; H01L 2224/08145; H01L 2224/08225; H01L 2224/16145; H01L 2224/48137; H01L 2224/48157; H01L 24/29; H01L 24/32; H01L 24/73; H01L 24/49; H01L 2223/6611; H01L 2223/6655; H01L 2223/6683; H01L 2224/29144; H01L 2224/32245; H01L 2224/48091; H01L 2224/48195; H01L 2224/49175; H01L 2224/73253; H01L 2224/73265; H01L 2224/83801; H01L 2924/00014; H01L 2924/10253; H01L 2924/10272; H01L 2924/1033; H01L 2924/14; H01L 2924/1423; H01L 2924/19105; H01L 2924/19107; H01L 23/04; H01L 23/057; H01L 23/4334; H01L 23/49531
See application file for complete search history.

(56) References Cited

U.S. PATENT DOCUMENTS

| | | | |
|---|---|---|---|
| 9,786,660 | B1 | 10/2017 | Farrell et al. |
| 9,807,882 | B1 | 10/2017 | Berdy et al. |
| 10,438,894 | B1 | 10/2019 | Farooq et al. |
| 10,855,244 | B2 | 12/2020 | Trang et al. |
| 11,114,988 | B2 | 9/2021 | Kim et al. |
| 11,521,957 | B1 | 12/2022 | Lee |
| 11,557,539 | B1 | 1/2023 | Romanczyk et al. |
| 11,587,852 | B2 | 2/2023 | Shilimkar et al. |
| 11,652,461 | B2 | 5/2023 | Trang et al. |
| 11,735,538 | B2 | 8/2023 | Radulescu |
| 2002/0179945 | A1 | 12/2002 | Sakamoto et al. |
| 2004/0238857 | A1 | 12/2004 | Beroz et al. |
| 2008/0099800 | A1 | 5/2008 | Miller et al. |
| 2009/0020848 | A1 | 1/2009 | Ono et al. |
| 2009/0091011 | A1 | 4/2009 | Das et al. |
| 2010/0109052 | A1 | 5/2010 | Nakajima et al. |
| 2011/0215472 | A1 | 9/2011 | Chandrasekaran |
| 2011/0304013 | A1 | 12/2011 | Chen et al. |
| 2011/0309372 | A1 | 12/2011 | Xin et al. |
| 2012/0018892 | A1 | 1/2012 | Soltan |
| 2012/0086497 | A1 | 4/2012 | Vorhaus |
| 2012/0299178 | A1 | 11/2012 | Kanaya et al. |
| 2013/0168854 | A1 | 7/2013 | Karikalan et al. |
| 2014/0014969 | A1 | 1/2014 | Kunii et al. |
| 2014/0054604 | A1 | 2/2014 | Ritenour |
| 2014/0159118 | A1 | 6/2014 | Lenci et al. |
| 2014/0184357 | A1 | 7/2014 | Jang |
| 2014/0239411 | A1 | 8/2014 | Brech et al. |
| 2014/0312458 | A1 | 10/2014 | Ashrafzadeh et al. |
| 2015/0171015 | A1 | 6/2015 | Mahajan et al. |
| 2015/0171080 | A1 | 6/2015 | Vorhaus |
| 2016/0087586 | A1 | 3/2016 | Szymanowski et al. |
| 2016/0285418 | A1 | 9/2016 | Jones et al. |
| 2017/0025349 | A1 | 1/2017 | Wood |
| 2017/0053909 | A1 | 2/2017 | Laighton et al. |
| 2017/0062319 | A1 | 3/2017 | Guo et al. |
| 2017/0085228 | A1 | 3/2017 | Abdo et al. |
| 2017/0110451 | A1 | 4/2017 | Fraser et al. |
| 2017/0294528 | A1 | 10/2017 | Ren et al. |
| 2018/0138132 | A1 | 5/2018 | Nishizawa et al. |
| 2019/0088607 | A1 | 3/2019 | Wang et al. |
| 2019/0097001 | A1 | 3/2019 | Laroche et al. |
| 2019/0131273 | A1* | 5/2019 | Chen ..................... H01L 21/568 |
| 2019/0148276 | A1 | 5/2019 | Chen et al. |
| 2019/0199289 | A1 | 6/2019 | Wei et al. |
| 2019/0304913 | A1 | 10/2019 | Wu et al. |
| 2019/0304952 | A1 | 10/2019 | Weis |
| 2019/0356274 | A1 | 11/2019 | Zhu et al. |
| 2020/0043946 | A1 | 2/2020 | Paul et al. |
| 2020/0105741 | A1 | 4/2020 | Lin et al. |
| 2020/0118922 | A1 | 4/2020 | Hill |
| 2020/0135766 | A1 | 4/2020 | Dutta et al. |
| 2020/0168602 | A1 | 5/2020 | Kojima et al. |
| 2020/0287536 | A1 | 9/2020 | Udrea et al. |
| 2020/0373892 | A1 | 11/2020 | Kim et al. |
| 2021/0098408 | A1 | 4/2021 | Ting et al. |
| 2021/0151428 | A1 | 5/2021 | Dutta et al. |
| 2021/0167199 | A1 | 6/2021 | Sriram et al. |
| 2021/0202408 | A1 | 7/2021 | Khalil et al. |
| 2021/0257472 | A1 | 8/2021 | Sato et al. |
| 2021/0398971 | A1 | 12/2021 | Som et al. |
| 2022/0020874 | A1 | 1/2022 | Fisher et al. |
| 2022/0044986 | A1 | 2/2022 | Khalil et al. |
| 2022/0190126 | A1 | 6/2022 | Kabir et al. |

FOREIGN PATENT DOCUMENTS

| | | |
|---|---|---|
| JP | H065634 B2 | 1/1994 |
| JP | H06267996 A | 9/1994 |
| JP | H1197616 A | 4/1999 |
| JP | 2006066719 A | 3/2006 |
| JP | 2006310726 A | 11/2006 |
| JP | 2008193097 A | 8/2008 |
| JP | 2010165789 A | 7/2010 |
| JP | 2010183100 A | 8/2010 |
| JP | 2011108813 A | 6/2011 |
| JP | 2011171697 A | 9/2011 |
| JP | 2011527113 A | 10/2011 |
| JP | 2014099668 A | 5/2014 |
| JP | 2015019002 A | 1/2015 |
| JP | 2016207802 A | 12/2016 |
| JP | 2017085013 A | 5/2017 |
| JP | 2019096772 A | 6/2019 |
| KR | 20140013618 A | 2/2014 |
| KR | 20180019226 A | 2/2018 |
| TW | 201810673 A | 3/2018 |
| TW | 201813016 A | 4/2018 |
| TW | 202013658 A | 4/2020 |
| WO | 2004075336 A1 | 9/2004 |
| WO | 2017029822 A1 | 2/2017 |
| WO | 2019132941 A1 | 7/2019 |

OTHER PUBLICATIONS

"Notification of Transmittal of the International Search Report and the Written Opinion of the International Searching Authority, or the Declaration for corresponding International Application No. PCT/US2021/021845, dated Jul. 5, 2021, (14 pages)".
"Notification of Transmittal of the International Search Report and the Written Opinion of the International Searching Authority, or the Declaration for corresponding International Application No. PCT/US2022/023916, dated Jun. 30, 2021, (13 pages)".
"Qin Zheng et al: "Electrical simulation of thin film inductors on silicon and glass substrates", 2014 Joint IEEE International Symposium , IEEE, May 12, 2014, pp. 555-559".

* cited by examiner

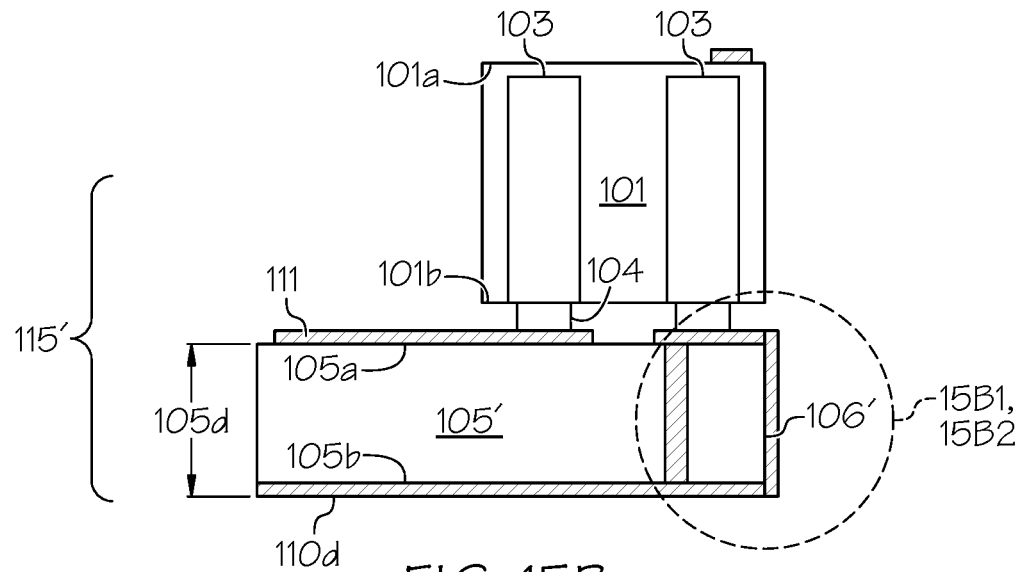
FIG. 15B
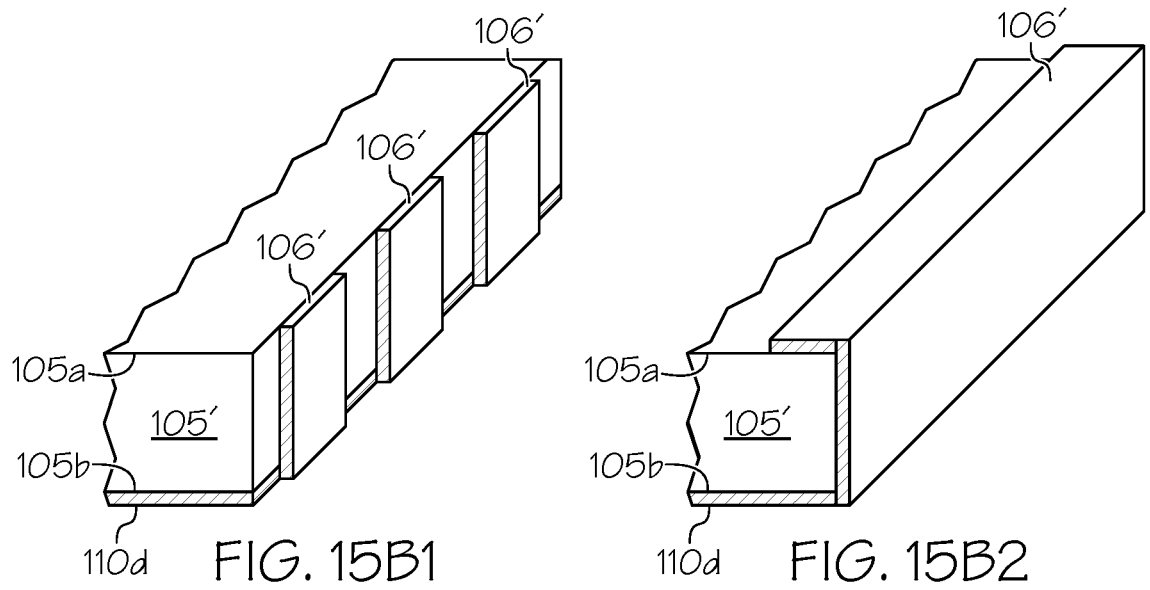
FIG. 15B1
FIG. 15B2

MULTI LEVEL RADIO FREQUENCY (RF) INTEGRATED CIRCUIT COMPONENTS INCLUDING PASSIVE DEVICES

CLAIM OF PRIORITY

This application claims the benefit of priority from U.S. Provisional Patent Application No. 63/004,758, filed Apr. 3, 2020, in the United States Patent and Trademark Office, the disclosure of which is incorporated by reference herein in its entirety.

FIELD

The present disclosure is directed to integrated circuit devices, and more particularly, to structures for integrated circuit device packaging.

BACKGROUND

RF power amplifiers are used in a variety of applications such as base stations for wireless communication systems, etc. The signals amplified by the RF power amplifiers often include signals that have a modulated carrier having frequencies in the megahertz (MHz) to gigahertz (GHz) range. The baseband signal that modulates the carrier is typically at a relatively lower frequency and, depending on the application, can be up to 300 MHz or higher. Many RF power amplifier designs utilize semiconductor switching devices as amplification devices. Examples of these switching devices include power transistor devices, such as MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

A device package for an RF power amplifier can include an active transistor die (e.g., including MOSFETs, HEMTs, LDMOS, etc.) along with input and output impedance matching circuits, for example, provided in a passive device. A die may refer to a small block of semiconducting material or other substrate on which a functional circuit is fabricated. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value.

Many functional blocks such as impedance matching circuits, harmonic filters, couplers and baluns and power combiner/divider can be realized by Integrated Passive Devices (IPDs). IPDs include passive electrical components and are generally fabricated using standard wafer fabrication technologies such as thin film and photolithography processing. IPDs can be designed as flip chip mountable or wire bondable components and the substrates for IPDs usually are thin film substrates like silicon, alumina or glass, which may allow for ease in manufacturing and packaging with active transistor dies.

SUMMARY

According to some embodiments described herein, a multi-level radio frequency (RF) integrated circuit component includes an upper level comprising at least one inductor, and a lower level comprising at least one conductive element that provides electrical connection to the at least one inductor. The lower level separates the at least one inductor from a lower surface that is configured to be attached to a conductive pad.

In some embodiments, the at least one conductive element may be a contact pad on an upper surface of the lower level, and/or a conductive through via extending between the upper surface and the lower surface of the lower level.

In some embodiments, the lower level may be a non-conductive material having the at least one conductive element thereon and/or therein.

In some embodiments, the lower level may include one or more voids in the non-conductive material.

In some embodiments, the non-conductive material may be a three-dimensional glass structure.

In some embodiments, the lower level may include at least one capacitor.

In some embodiments, the lower level may include at least one active electronic component.

In some embodiments, the lower level may include first and second levels defining a stepped structure, where the second level includes the lower surface.

In some embodiments, the at least one inductor of upper level may define at least a portion of an impedance matching circuit or harmonic termination circuit for a RF power amplifier.

In some embodiments, the upper level may be an integrated passive device (IPD) including the at least one inductor, and the lower level may be an intermediate substrate including the lower surface.

In some embodiments, the upper level and the lower level may collectively define an integrated passive device (IPD) including the at least one inductor.

In some embodiments, the upper level and the lower level may define a monolithic structure.

According to some embodiments, an integrated circuit device package includes a package substrate comprising a conductive attachment surface, and a multi-level radio frequency (RF) integrated circuit component on the conductive attachment surface. The multi-level RF integrated circuit component includes an upper level comprising at least one inductor, and a lower level comprising at least one conductive element that provides electrical connection to the at least one inductor. The lower level separates the at least one inductor from the conductive attachment surface.

In some embodiments, the at least one conductive element may be a contact pad on an upper surface of the lower level, and/or a conductive through via extending between the upper surface and a lower surface of the lower level adjacent the conductive attachment surface.

In some embodiments, the at least one conductive element may be at least one first conductive element. An active die may be provided on the conductive attachment surface. The active die may include a plurality of transistor cells and at least one second conductive element electrically connected to one or more of the transistor cells. The at least one second conductive element may be electrically connected to the at least one first conductive element.

In some embodiments, the at least one second conductive element may include an input pad, an output pad, and/or a ground pad for the one or more of the transistor cells of the active die. In some embodiments, the input pad, output pad, and ground pad may be connected to a gate, drain, and source terminal, respectively, of the one or more transistor cells.

In some embodiments, the active die may be on the conductive attachment surface adjacent the lower level, and the first and second conductive elements may be first and second bond pads, with a wirebond electrically connecting the second bond pad to the first bond pad.

In some embodiments, the transistor cells of the active die may define a RF power amplifier, and the at least one inductor may defines at least a portion of an impedance matching circuit or harmonic termination circuit for the RF power amplifier.

In some embodiments, the lower level may be stacked on the conductive attachment surface with the active die therebetween.

In some embodiments, the active die may be on the conductive attachment surface adjacent the lower level with a gap therebetween, and the upper level may bridge the gap.

In some embodiments, the multi-level RF integrated circuit component may include an output pad electrically connected to the at least one inductor, a frame member adjacent the lower level on the conductive attachment surface, the frame member comprising a package lead, and a wirebond that extends adjacent the upper level and electrically connects the output pad to the package lead.

In some embodiments, the lower level may include at least one active electronic component.

In some embodiments, the lower level may include at least one capacitor.

In some embodiments, the lower level may include a non-conductive material having the at least one conductive element thereon and/or therein.

In some embodiments, the lower level may include one or more voids in the non-conductive material.

In some embodiments, the non-conductive material may be a three-dimensional glass structure.

In some embodiments, the upper level may be an integrated passive device (IPD) including the at least one inductor, and the lower level may be an intermediate substrate defining a step difference that separates the at least one inductor from the conductive attachment surface.

In some embodiments, the upper level and the lower level may collectively define an integrated passive device (IPD) including the at least one inductor.

According to some embodiments, a radio frequency (RF) integrated circuit component includes a body of dielectric material, conductive elements defining at least one discrete electronic component in the body of dielectric material, and at least one void in the body of dielectric material and defining a portion of the at least one discrete electronic component.

In some embodiments, the at least one void may be at least partially surrounded by the body of dielectric material.

In some embodiments, the body of dielectric material may be glass, ceramic, or plastic.

In some embodiments, the at least one discrete electronic component may include at least one of an inductor, a capacitor, or a resistor.

In some embodiments, the at least one discrete electronic component may define at least a portion of an input, interstage, or output impedance matching circuit or a harmonic termination circuit for a RF power amplifier.

In some embodiments, the body of dielectric material may define a first level and a second level on the first level. The at least one discrete electronic component may be in or on one of the first or second levels, and at least one of the first level, the second level, or a level therebetween may include the at least one void therein.

In some embodiments, the body of dielectric material may be a three-dimensional glass structure. The conductive elements may further include a contact pad on a surface of the three-dimensional glass structure, and/or a conductive through via extending through the three-dimensional glass structure.

According to some embodiments, a multi-level radio frequency (RF) integrated circuit package includes a substrate, and a multi-level integrated device on the substrate. The multi-level integrated device includes a first level, a second level, and a conductive contact element. At least one of the first or second levels comprises a discrete electronic component that is electrically connected to the conductive contact element, and the conductive contact element is electrically connected to at least one of matching circuitry, harmonic termination circuitry, an active transistor die, or a package lead.

In some embodiments, the first level may be on the substrate, and the second level may include the discrete electronic component and may be on the first level opposite the substrate.

In some embodiments, the discrete electronic component may be a reactive component.

In some embodiments, the conductive contact element may be between an upper surface of the multi-level integrated device and the lower surface.

In some embodiments, the discrete electronic component may be a second discrete electronic component, and the first level may include a first discrete electronic component.

In some embodiments, the conductive contact element may include first and second conductive contact elements that are electrically connected to the first and second discrete electronic components, respectively. Each of the first and second conductive contact elements may be electrically connected to at least one of the matching circuitry, the harmonic termination circuitry, the active transistor die, or the package lead.

In some embodiments, the conductive contact element may include at least one first conductive contact element, and the package may include the active transistor die on the substrate. The active die may include a plurality of transistor cells and at least one second conductive contact element electrically connected to one or more of the transistor cells. The at least one first conductive contact element may be electrically connected to the active transistor die via the at least one second conductive contact element.

In some embodiments, the at least one second conductive contact element may include an input pad, an output pad, and/or a ground pad for the one or more of the transistor cells of the active transistor die.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 15A, 15B, and 15C are cross-sectional views illustrating examples of conductive interconnections configured to provide electrical connections between respective levels or surfaces of multi-level integrated circuit structures in accordance with embodiments of the present disclosure.

FIGS. 15A1 and 15A2 are perspective views illustrating examples of the conductive interconnections of FIG. 15A.

FIGS. 15B1 and 15B2 are perspective views illustrating examples of the conductive interconnections of FIG. 15B.

DETAILED DESCRIPTION

Figure 1A:
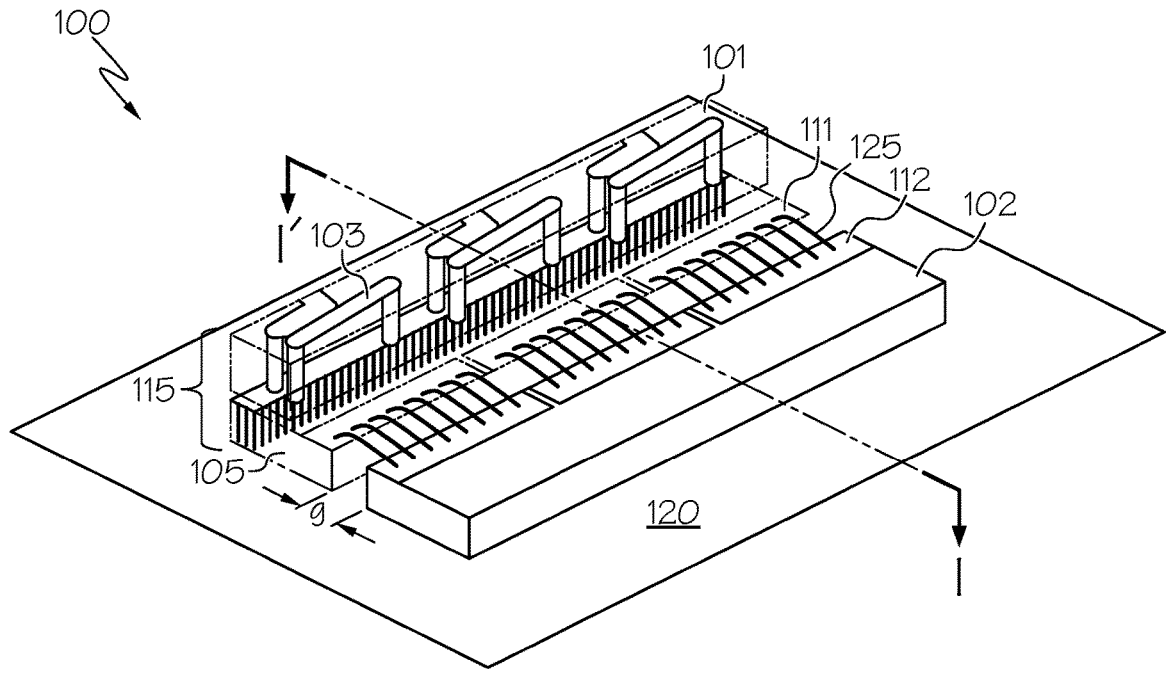
FIGS. 1A and 1B are perspective and cross-sectional views, respectively, illustrating examples of integrated circuit device packages including passive RF components with multi-level integrated circuit structures in accordance with some embodiments of the present disclosure.

Some embodiments of the present disclosure may arise from realization that it may be difficult to optimize multiple parameters of the different dies included in an integrated circuit device package. For example, performance of passive electronic components (e.g., including reactive components such as inductors or capacitors, and resistive components such as resistors) included in a die or IPD (generally referred to herein as a passive device or passive RF component), may be affected based on proximity to a ground plane. In particular, the quality factor Q of inductor coils may be reduced as a distance between the windings of the inductor coils and a ground-connected flange is reduced. However, as dies are typically planar structures with only one surface providing conductive contact elements (also referred to herein as bond pads) for electrical connections to external dies or devices, increasing the distance between the passive components and the ground plane may increase the length of connections (and thus series inductance) with one or more active electronic components (e.g., transistors, such as power transistor devices) included in an active transistor die (generally referred to herein as an active die). While the thickness of the active die can be increased to reduce the length of the connections with the passive components, the increased thickness may negatively affect performance, for example, due to increased thermal effects and source inductance feedback.

That is, performance of components or circuits of an active die may be improved or optimized by reducing the thickness of the active transistor die, but such optimization may be sub-optimal for performance of components or circuits of a passive device, such as inductor coils or spiral inductors (e.g., planar microstrip spiral inductors) whose quality factor Q may be reduced as its windings are placed in closer proximity with the ground connected flange. If a passive device having a single bonding level is optimized for performance of spiral inductors by increasing the thickness of the passive device, there may be significant series inductance introduced between the thin active die and the thicker passive device, which may reduce or negate the effectiveness of the impedance matching networks and/or harmonic termination circuits provided by the components of the passive device, particularly at higher frequencies.

Accordingly, embodiments of the present disclosure are directed to passive RF components that provide conductive contact elements, such as bond pads, at one or more levels (that is, multiple connection levels) between an upper level that includes one or more inductors and an attachment surface, such as the ground-connected flange of a device package. For example, some bond pads of the passive RF components may be provided at a level or height (relative to the attachment surface) that is similar to or closely matching the height of an active transistor die (or the bond pads thereof), allowing for a shorter and thus lower inductance connections therebetween. In addition, the distance between a ground-connected die pad or flange of a package substrate and the inductor(s) or other passive components of the upper level may be increased, thereby reducing or minimizing negative effects on the quality factor Q. Some embodiments of the present disclosure may thus allow for design of high Q passive RF components, with a lower level such as an intermediate substrate or structure (e.g., glass, ceramic, plastic, printed circuit board (PCB), etc.) providing the inductors or other passive components with adequate distance or clearance away from ground to prevent capacitive coupling and inductor Q reduction. Since the lower level can include multiple levels or layers, other bond pads or attach options may be implemented at different levels or heights between the upper level and the attachment surface for, but not limited to, connection to a package window frame and/or one or more electrically conductive leads thereon.

Some embodiments of the present disclosure may provide passive RF components having multi-level integrated circuit structures (also referred to herein as multi-level RF integrated circuit components) that allow for attachment of IPDs (or other passive devices) that may implement portions of an internal impedance matching circuit (including input, inter-stage, or output impedance matching circuits) and/or harmonic termination circuit to active dies via low inductance wirebond connections. As noted above, IPDs include inductors and/or other passive electrical components, and may be fabricated using standard semiconductor processing techniques such as thin film and/or photolithography processing. IPDs can be flip chip mountable or wire bondable components, and may include thin film substrates such as silicon, alumina, or glass. The multi-level integrated circuit structure may include a lower level (for example, as provided by an intermediate substrate or other multi-step or multi-level structure) with an upper level (including the passive device) thereon, and may thus implement the low series inductance connections from the lower level to the active die with relatively flat wires. As such, longer wire bond loops with higher series inductance to bond pads at the top or upper surface of the passive device may be eliminated.

Figure 1B:
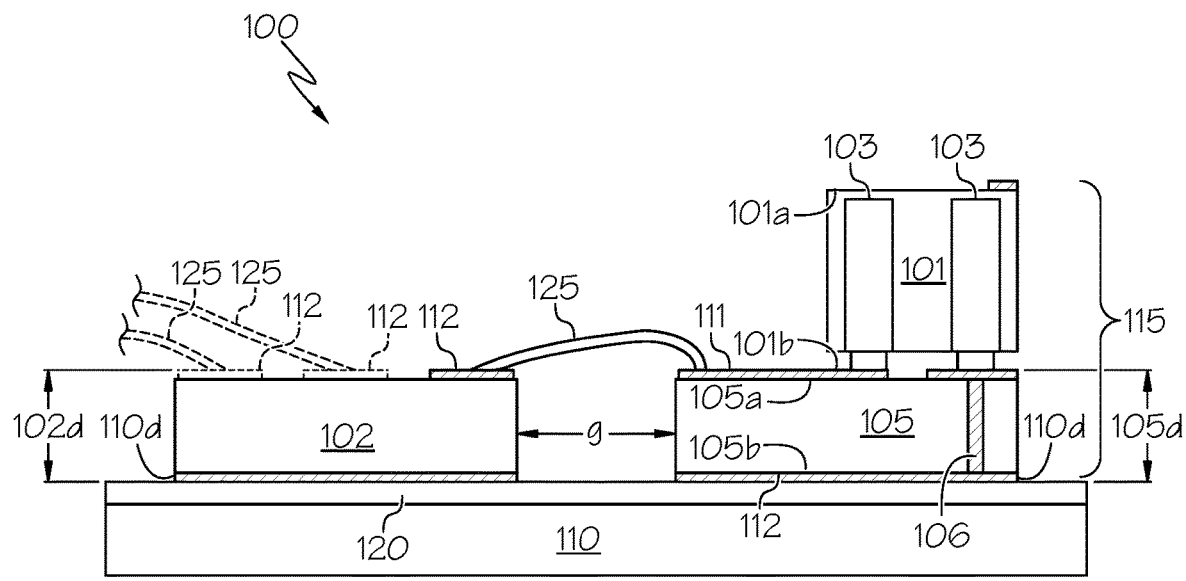

FIG. 1A is a perspective view and FIG. 1B is a cross sectional view (taken along line I-I' of FIG. 1A) illustrating an integrated circuit device package 100 including multi-level integrated circuit structures 115 in accordance with some embodiments of the present disclosure. As shown in FIGS. 1A and 1B, the package 100 includes a package substrate 110 with a first device 101 and a second device 102 attached to the package substrate 110 at an attachment surface 120 (e.g., a conductive die attach pad or flange, also referred to herein as a conductive die pad or die pad) by respective bonding layers and/or die attach material layers 110d. The multi-level integrated circuit structure 115 includes an upper level 101 (illustrated as a passive device with one or more inductors) and a lower level 105 (illustrated as an intermediate substrate) defining a step structure or step difference relative to the conductive die pad 120. As shown in the examples of FIGS. 1A and 1B, the intermediate substrate (or other lower level) 105 may be external to the passive device (or other upper level) 101 in some embodiments. In other embodiments, the intermediate substrate 105 and the passive device 101 may be integrated in the same die, such that any of the multi-level RF integrated circuit components (e.g., 115, 215, 315, 415, 515, 615, 915) described herein define a monolithic or unitary structure including a lower level 105 and an upper level 101.

The die pad 120 can have a generally planar upper surface that is configured to accommodate one or more integrated circuit devices (e.g., transistors, chip capacitors, etc.) for mounting thereon. The die pad 120 can include any of a variety of electrically conductive materials, including electrically conductive metals such as copper (Cu), gold (Au), aluminum (Al), and alloys thereof. For example, the die pad 120 may be part of a metal baseplate that is made of an electrically and thermally conductive material such as Cu, a Cu alloy such as copper-tungsten (CuW) or CPC (copper, copper-molybdenum, copper laminate structure), or a metal-matrix composite. A metal slug (not shown) can be disposed beneath the die pad 120, and a heatsink (not shown) including a thermal conductor, e.g., aluminum or copper can be disposed beneath the metal slug and extend to a lower side of the package substrate 110.

Figure 10:
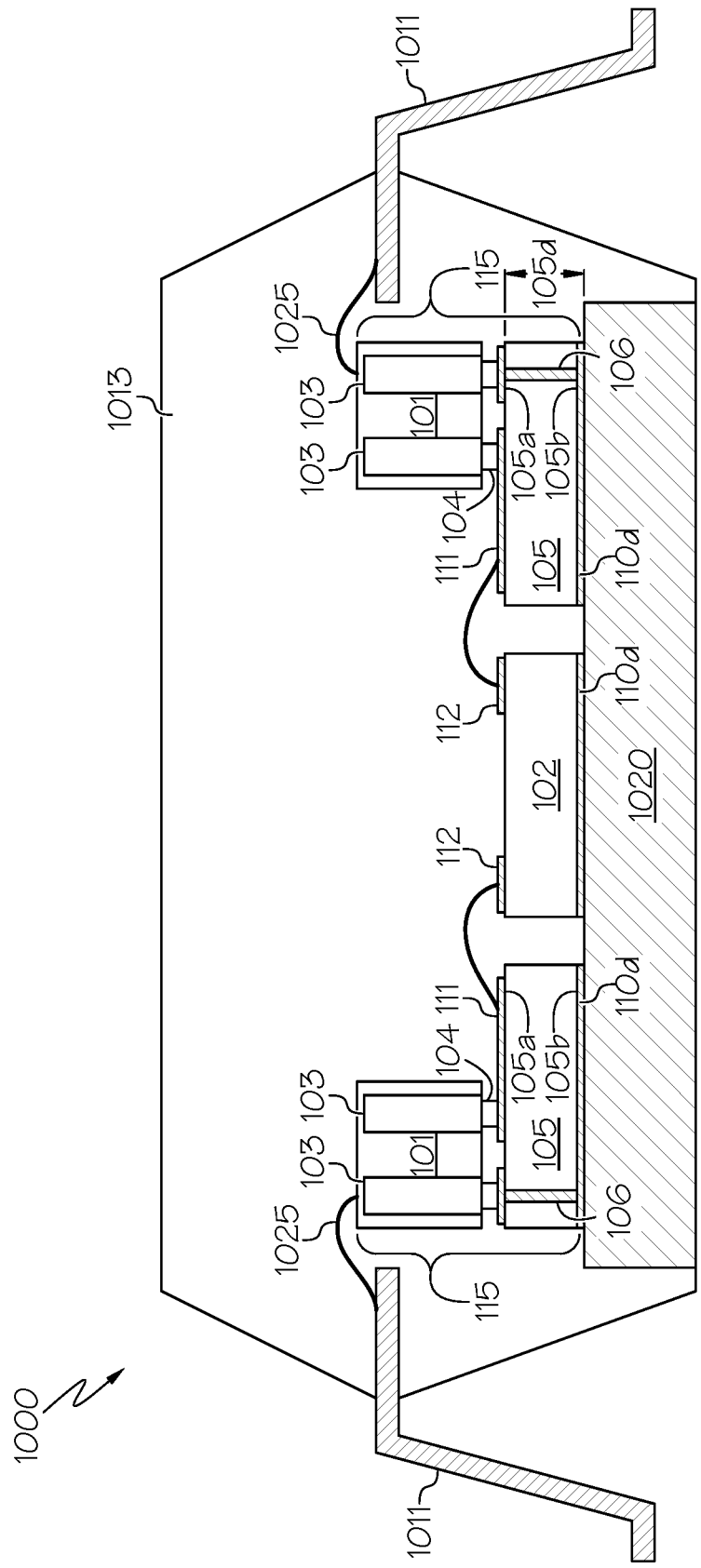
FIGS. 10, 11, and 12 are cross-sectional views illustrating examples of over mold-, open cavity ceramic-, and open cavity PCB-type integrated circuit device packages, respectively, including passive RF components with multi-level integrated circuit structures in accordance with some embodiments of the present disclosure.
Figure 11:
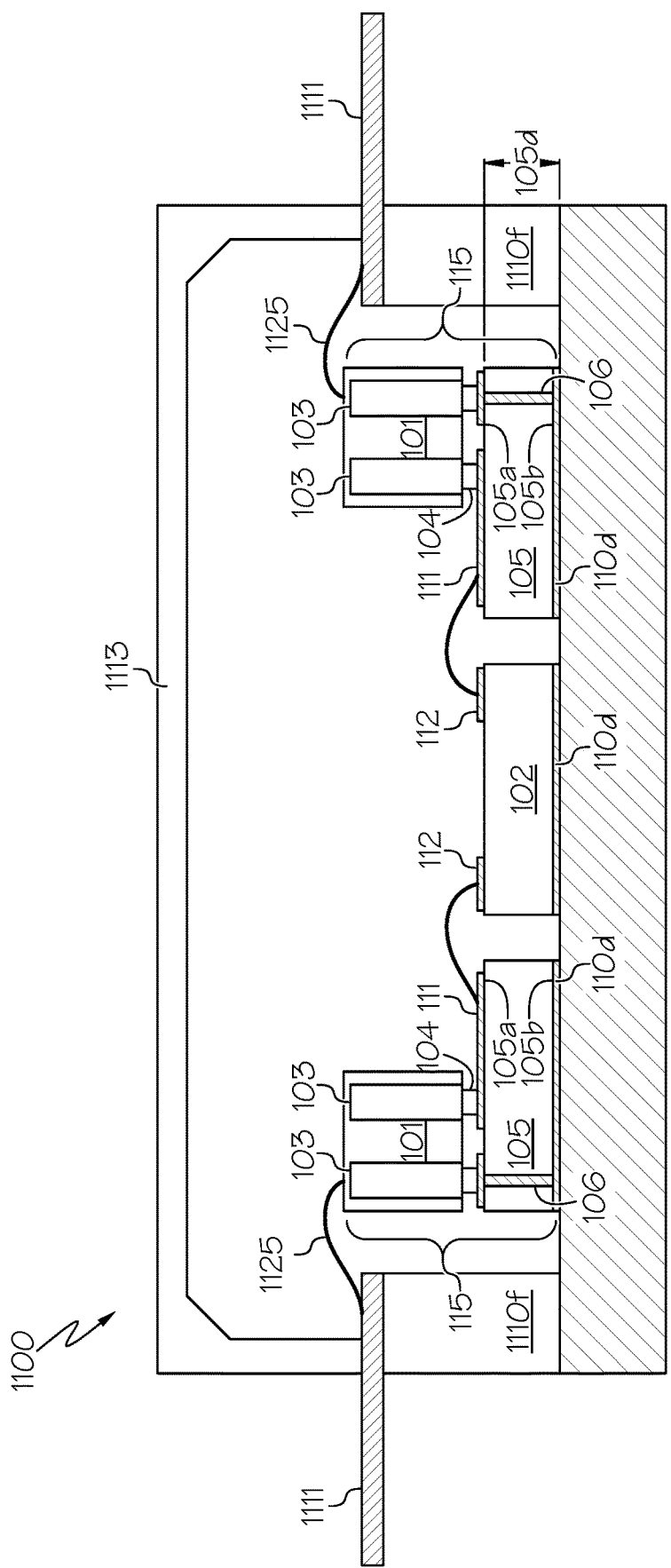
Figure 12:
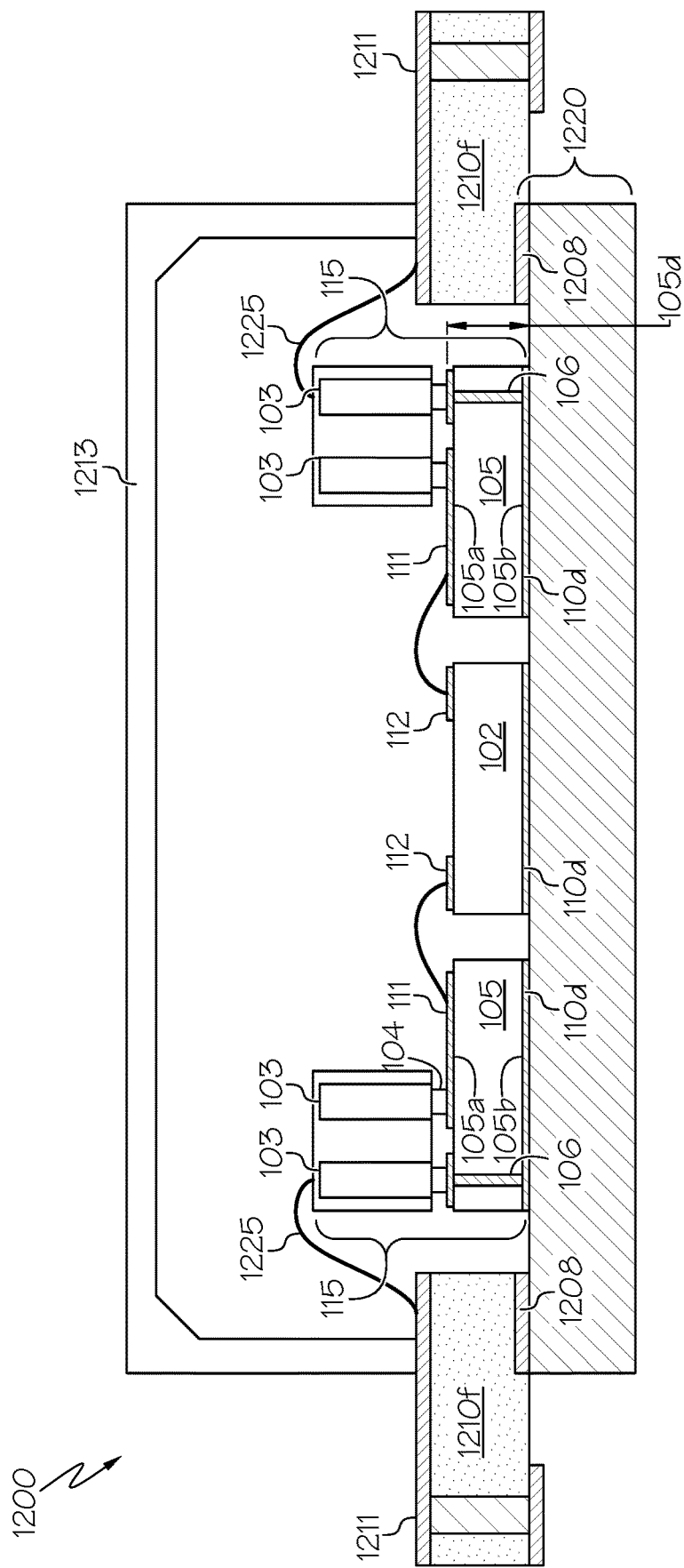

The die pad 120 may be configured to provide an electrical ground for one or more components 101, 102, 103 of the package 100. In some embodiments, the die pad 120 and/or the substrate 110 may be integral to the package 100. The conductive die pad 120 may be recessed relative to the package substrate 110 and/or a frame member 110f (shown in FIGS. 7A-7C) surrounding the conductive die pad 120. The frame member 110f can include a variety of electrically and/or thermally insulating materials such as ceramic, plastic, etc. The package 100 may also include a plurality of electrically conductive leads 111f (shown in FIGS. 7A-7C) that provide electrical access between the packaged components 101, 102 that are mounted on the die pad 120 and an external device, e.g., a printed circuit board. The package 100 may include the components 101, 102, 103 in a packaging material that encapsulates or otherwise provides protection for the components 101, 102, 103 while providing access to the leads 111f for connection to circuits or devices that are external to the package 100, generally referred to herein as external devices. The packaging material may include over mold or open cavity type packaging. For example, over mold type packaging may include a plastic (OMP; as shown in FIG. 10) or other over mold that encapsulates the components 101, 102, 103. Open cavity type packaging may include a thermally enhanced package (open cavity ceramic; as shown in FIG. 11 or open cavity PCB; as shown in FIG. 12), including ceramic materials, that define a cavity surrounding the components 101, 102, 103. The package substrates as described herein may generally refer to any substrate that provides electrical connections and attachment surface for one or more of the components 101, 102, 103, such as the substrates 1020, 1120, and/or 1220 described below with reference to OMP, open cavity ceramic, and/or open cavity PCB-type packages, and/or a redistribution layer (RDL) structure including one or more insulating layers and conductive traces.

The upper level 101 includes one or more passive electronic components 103 (e.g., discrete electronic components such as individual inductors, capacitors, resistors), and may also be referred to herein a passive device. For example the passive device 101 may be an IPD in some embodiments. In some embodiments, the passive device 101 may exclusively include the passive electronic components 103 (i.e., resistive components and/or reactive components); that is the passive device 101 may be free of active electronic components. In other embodiments, the upper level 101 may include active electronic components. One or more conductive bond pads 111 are electrically connected to the one or more passive electronic components 103. In some embodiments, the passive device 101 has a lower surface 101b that is configured to attach the passive device 101 to an underlying structure (such as the die pad 120 and/or the intermediate substrate 105 described herein), and an upper surface 101a opposite the lower surface 101b. For example, the lower surface 101b of the passive device 101 may include structures and/or conductive layers that are configured to physically and/or electrically connect the components 103 of the die 101 to an underlying structure. In the embodiments of FIGS. 1A and 1B, the one or more passive electronic components 103 include conductive standoff structures 104 that provide electrical connection with the bond pads 111.

The active die 102 includes one or more active electronic components. For example, the active die 102 may be a semiconductor die, and may include transistors (such as power transistors) or other active electrical devices and associated conductive lines and metal layers. In some embodiments, the active die 102 may include discrete multi-stage, MMIC, and/or multi-path (e.g., Doherty) transistor devices. The active die 102 may include silicon (Si), silicon carbide (SiC), and/or Group III nitride-based materials, such as gallium nitride (GaN), in some embodiments. One or more conductive bond pads 112 are electrically connected to the one or more active electronic components of the active die 102. The conductive bond pads 112 of the active die 102 may be or include input (e.g., gate), output (e.g., drain), and/or ground (e.g., source) pads in various embodiments. One or more bonding layers or die attach material layers 110d (e.g., gold-tin (AuSn)) may attach the lower surfaces of the lower level 105 of the structure 115 and/or the active die 102 to the die pad 120.

Respective wire bonds 125 electrically connect the bond pads 112 of the active die 102 to the bond pads 111 of the passive device 101. For example, the one or more active electronic components of the active die 102 may define an RF power amplifier, the one or more resistive and/or reactive electronic components 103 of the passive device 101 may define at least a portion of an impedance matching circuit (e.g., an input, output, or inter-stage impedance matching circuit) for the RF power amplifier, and the wire bonds 125 may provide the electrical connections between the active electronic components of the active die 102 and the impedance matching circuit components 103 of the passive device 101. Due to the thickness of the active die 102 relative to the thickness of the passive device 101, the bond pads 112 may be closer to the die pad 120 than bond pads on an upper surface of the passive device 101, which may conventionally require longer wirebond connections between the active die 102 and the passive device 101.

Figure 16A:
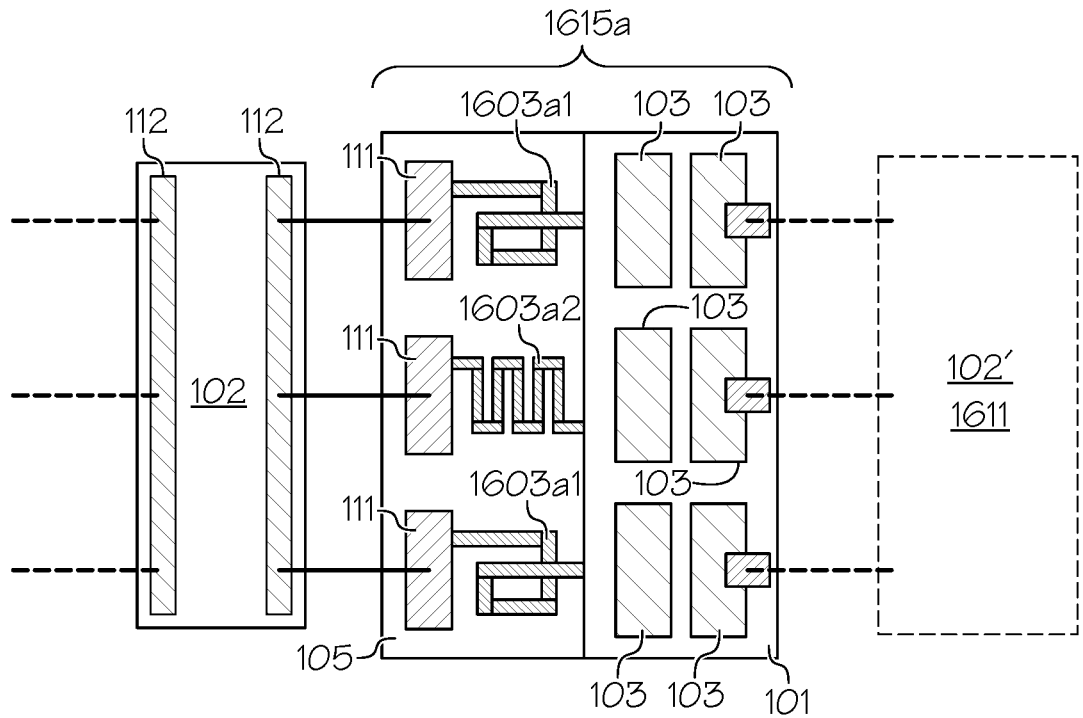
FIGS. 16A, 16B, 16C, 16D, and 16E are plan views illustrating examples of integrated circuit device packages including planar passive RF components with single- or multi-level integrated circuit structures in accordance with some embodiments of the present disclosure.

Embodiments of the present disclosure provide multi-level RF integrated circuit component structures (e.g., 115, 215a, 215b, 315, 415, 515, 615, 915) having a lower level (e.g., an intermediate structure or substrate) 105 that is configured to separate one or more inductors or other passive components 103 of an upper level or passive device 101 from the conductive die pad 120. The embodiments described herein may refer to the upper level 101 and the passive device interchangeably. The lower level 105 may be free of inductors, and separates the inductors or other passive electronic components 103 of the upper level 101 from the die pad 120 by a vertical distance or spacing. In some embodiments, the lower level 105 may include other passive electronic components (such as capacitors and/or resistors) and/or active electronic components (such as transistors). In some embodiments, the lower level 105 may include planar inductors on a surface (e.g., 105a) thereof (e.g., as shown in FIG. 16A). That is, multi-level RF integrated circuit component structures as described herein may include an upper level 101 including at least one inductor, and a lower level including inductors, capacitors, resistors, and/or transistors. In some embodiments, the upper level 101 and lower level 105 may collectively define an IPD. Also, unless otherwise specified, multi-level integrated circuit structures component structures described herein (e.g., 115, 215a, 215b, 315, 415, 515, 615, 915) may be connected to the input and/or output of one or more active dies 102 in a package, to implement input, output, and/or inter-stage impedance matching/harmonic termination circuits.

The lower level 105 includes a first or upper surface 105a including the upper level 101 thereon, and a second or lower surface 105b opposite the first surface 105a. In some embodiments, the lower level 105 may include a non-conductive or dielectric material (e.g., glass, ceramic, plastic, PCB, etc.) and may include one or more conductive interconnections 106 (e.g., through substrate vias) extending between the surfaces 105a, 105b that electrically connect the passive device 101 to the conductive die pad 120. For example, the lower level 105 may be a three-dimensional (3D) glass-based structure or intermediate substrate in some embodiments. Although shown as a single layer, the lower level 105 may include one or more distinct layers (e.g., as shown by layers 105, 105' in FIG. 3), or may be a monolithic layer that defines multiple steps or levels (e.g., as shown by layer 101/105 in FIG. 2B). The lower level 105 is positioned or placed on the die pad 120 adjacent the active die 102, with a spacing or gap g therebetween.

The lower level 105 of the structure 115 is configured to define one or more step differences between the passive device 101 and the die pad 120. In the example of FIGS. 1A and 1B, a thickness 105d of the lower level 105 between the surfaces 105a, 105b is configured to provide the step difference that separates the passive device 101 from the lower surface 105b thereof, which is adjacent and configured for attachment to the die pad 120. The distance 105d between the passive electronic components 103 of the upper level 101 and the conductive die pad 120 may improve performance of the passive electronic components 103. For example, where the passive electronic components 103 include inductor coils and the conductive die pad 120 provides an electrical ground plane, the increased isolation (based on the vertical distance 105d) between the passive device 101 and the lower surface 105b (and thus, the die pad 120 to which the lower surface 105b is attached or otherwise adjacent) may improve the quality factor Q of the inductor coils, which may otherwise degrade as the windings of the inductor coils are in closer proximity to the ground plane.

In addition, the one or more step differences or levels provided by the lower level 105 may allow the bond pads 111 that are connected to the passive device 101 to be closer to the die pad 120. This may allow for shorter wirebonds 125 between the bond pads 112 of the active die 102 and the bond pads 111 without altering the distance or spacing g therebetween, while simultaneously reducing or minimizing negative effects of proximity to the die pad 120 on the quality factor Q of the passive electronic components 103 of the passive device 101. For example, the bond pads 111 may be provided on or adjacent the surface 105a of the lower level 105 including the passive device 101 thereon. The thickness 105d of the lower level 105 may be greater than, less than, or equal to the thickness 102d of the active die 102, so as to reduce the distance between the bond pads 112 and the bond pads 111. For example, the thickness 105d of the lower level 105 may be substantially similar to that of the active die 102, such that the bond pads 111 and the bond pads 112 are on substantially coplanar surfaces.

The lengths of the respective wirebonds 125 are thus shorter than the distance between the second bond pads 112 and the passive device 101, which can reduce series inductance in connecting the components of the active die 102 to the components of the passive device 101. For example, the wirebonds 125 can be made short (by positioning the intermediate substrate 105 closer to the active die 102) and substantially linear or "flat" (by providing the lower level 105 with a thickness 105d similar to that of the active die 102) to reduce or minimize the series inductance introduced by the wirebonds 125.

Accordingly, the structure 115 includes a lower level 105 that defines a step structure that is positioned between the passive device 101 and the conductive die pad 120, which can increase a distance between the passive component(s) 103 of the passive device 101 and the die pad 120, and also reduce a distance between the bond pads 111 connected to the passive device 101 and the bond pads 112 of the active die 102. More generally, the bond pads 111 may be on one or more surfaces of the structure 115 that are closer to the die pad 120 (and thus, closer to the bond pads 112 of the active die 102) than the upper surface 101a and/or the lower surface 101b of the passive device 101. That is, the structure 115 provides one or more surfaces including bond pads 111 thereon, which are non-coplanar with the upper surface 101a and/or the lower surface 101b of the passive device 101. The thickness 105d and/or a material of the intermediate substrate or other lower level 105 may also be selected to reduce capacitive coupling to the ground plane of the conductive die pad 120.

Figure 2A:
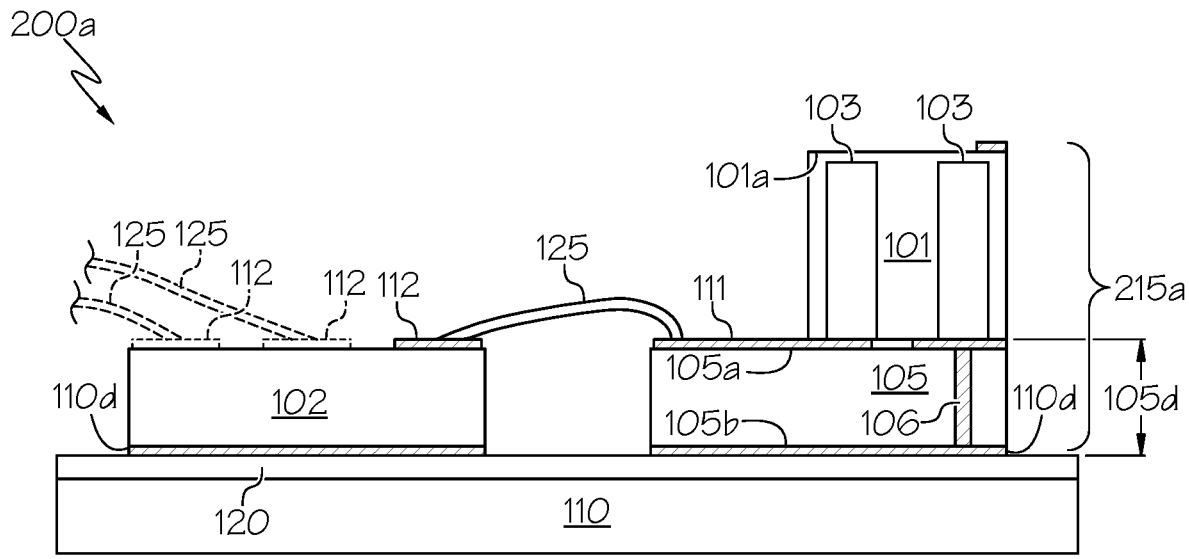
FIGS. 2A, 2B, 3, 4, 5, and 6 are cross-sectional views illustrating examples of integrated circuit device packages including passive RF components with multi-level integrated circuit structures in accordance with further embodiments of the present disclosure.

FIG. 2A is a cross-sectional view illustrating an integrated circuit device package 200a including passive RF components with multi-level integrated circuit structures 215a in accordance with some embodiments of the present disclosure. As shown in FIG. 2A, the package 200a includes components 101, 102, 105 arranged on an attachment surface (e.g., a conductive die pad 120) of a package substrate 110 in a manner similar to the package 100 of FIGS. 1A and 1B. In the example of FIG. 2A, the structure 215a provides the lower surface 101b of the passive device 101 directly on the lower level 105 (illustrated as intermediate substrate), i.e., without the conductive standoff structures 104. That is, the bond pads 111 and/or the through substrate vias 106 at the surface 105a of the lower level 105 are directly connected to the passive electronic components 103 of the passive device 101. The thickness 105d similarly separates the passive electronic component(s) 103 from the lower surface 105b and the die pad 120 with sufficient distance or clearance to reduce or avoid capacitive coupling and/or inductor Q reduction, while reducing or minimizing the height difference (and thus, the lengths of the bond wires 125) between the bond pads 111 connected to the components of the passive device 101 and the bond pads 112 connected to the components of the active die 102. As noted above, the bond pads 112 of the active die 102 may include input (e.g., gate), output (e.g., drain), and/or ground (e.g., source) pads, which may be directly or indirectly connected to corresponding terminals of the transistor cells of the active die 102 (e.g., gate, drain, and source terminals of a FET, such as a HEMT or LDMOS transistor). Thus, embodiments of the multi-level RF integrated circuit component structures and/or other circuitry described herein can be electrically coupled to any of the input (e.g., gate), output (e.g. drain), vias, and/or ground (e.g. source) of the transistor cells of the active die 102. The bond pads 112 are shown in phantom in some embodiments to indicate such multiple connections.

Figure 2B:
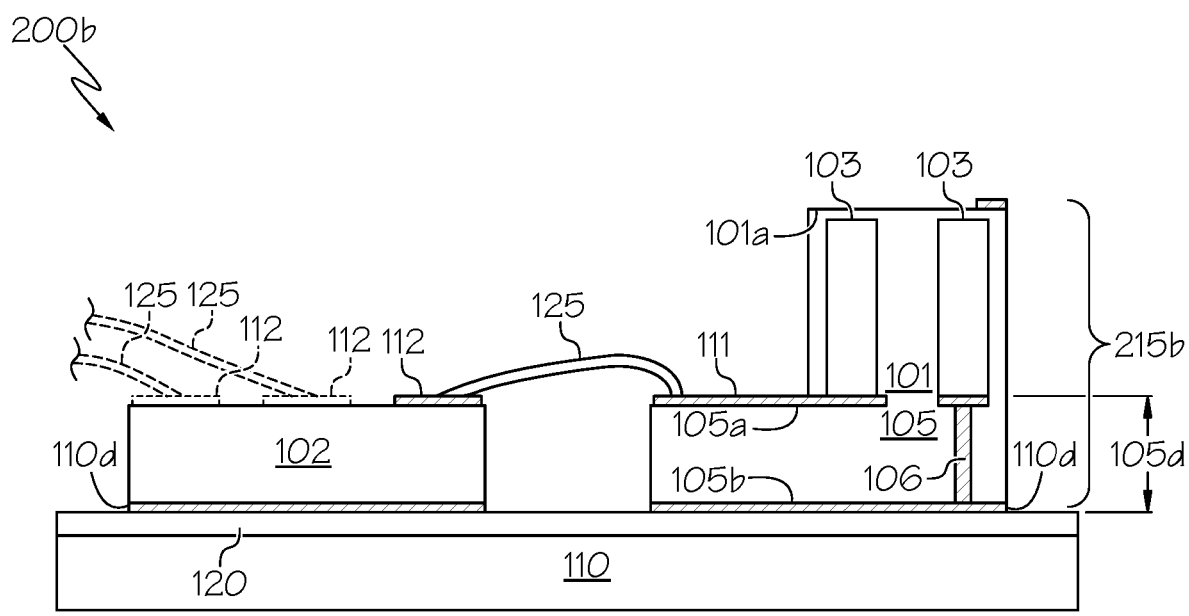

FIG. 2B is a cross-sectional view illustrating an integrated circuit device package 200b including passive RF components with multi-level integrated circuit structures 215b in accordance with some embodiments of the present disclosure. As shown in FIG. 2B, the package 200b includes components 102 and 101/105 arranged on an attachment surface (e.g., a conductive die pad 120) of a package substrate 110. In the example of FIG. 2B, the structure 215b implements the passive device (101 in FIG. 2A) and the lower level (105 in FIG. 2A) in a unitary or monolithic structure 101/105, with a first upper surface or level 101a and a second upper surface or level 105a defining a step structure. The structure 101/105 may include a non-conductive or dielectric material (e.g., glass, ceramic, plastic, PCB, etc.) with the passive electronic components 103 and conductive interconnections 106 electrically connected within the structure 101/105. The package 200b may otherwise be similar to the package 200a of FIG. 2A.

Embodiments are described herein with reference to multi-level integrated circuit structures including an intermediate substrate or other lower level 105 that separates passive electronic components 103 from a lower surface 105b thereof that is configured to be attached to or is otherwise adjacent an attachment surface 120 with reference to a single level or thickness by way of example. However, it will be understood that the multi-level integrated circuit structures described herein may implement the lower level with multiple layers or thicknesses in some embodiments, as shown for example in FIG. 3.

Figure 3:
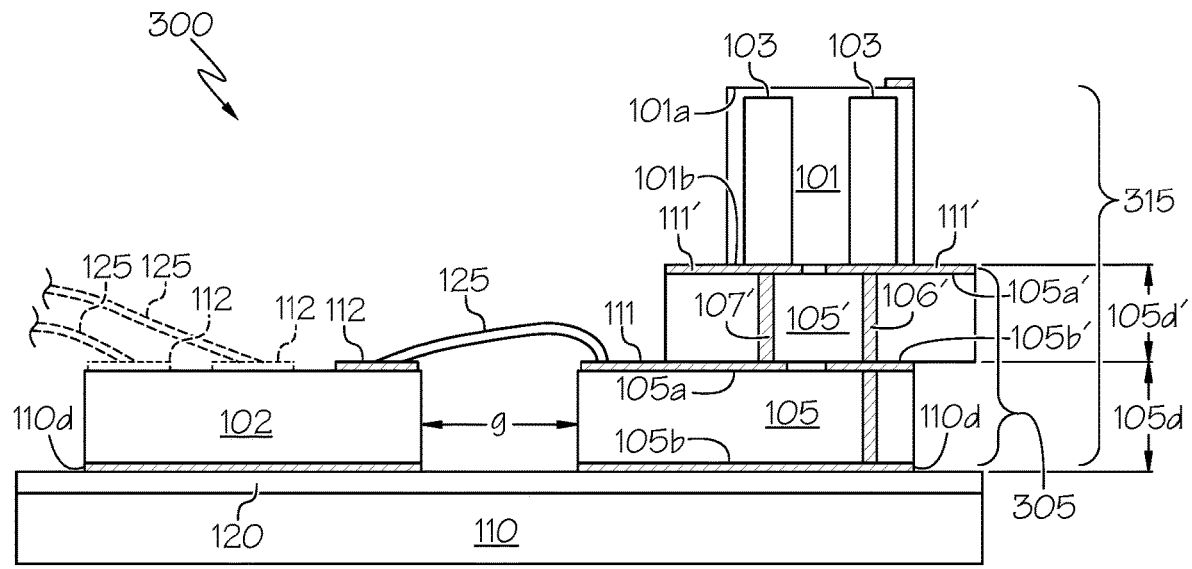

FIG. 3 is a cross-sectional view illustrating an integrated circuit device package 300 including passive RF components with multi-level integrated circuit structures 315 in accordance with some embodiments of the present disclosure. As shown in FIG. 3, the package 300 includes components 101, 102, 105 arranged on a surface (e.g., a conductive die pad 120) of a package substrate 110 in a manner similar to the package 100 of FIGS. 1A and 1B. The structure 315 further includes a multi-level lower intermediate substrate or other lower level 305. The lower level 305 includes first and second levels defined by surfaces 105a' and 105a with bond pads 111' and 111 thereon, respectively.

In the example of FIG. 3, the first and second levels are defined by first and second intermediate layers 105' and 105, respectively. The first layer 105' includes an upper surface 105a' with the passive device 101 thereon at a first level relative to the conductive die pad 120, and a lower surface 105b' on an upper surface 105a of the second layer 105. The second layer 105 includes the bond pads 111 on the upper surface 105a at a second level relative to the conductive die pad 120, and a lower surface 105b attached to the die pad 120. The lower level 305 further includes conductive contact elements 107 (e.g., through substrate vias) extending therethrough that electrically connect the bond pads 111 on the second level or surface 105a to the one or more passive electronic devices 103 of the passive device 101 on the first level or surface 105a', as well as the conductive interconnections 106 that electrically connect the passive device 101 to the conductive die pad 120.

The thickness 105d of the second layer 105 may be less than, greater than, or equal to the thickness of the active die 102. For example, the thickness 105d of the second layer 105 may be substantially similar to the thickness of the active die 102 such that the bond pads 111 and 112 are on substantially coplanar surfaces at the second level to reduce or minimize the length of the wirebonds 125. The thickness 105d' of the first layer 105' may provide the passive device 103 at a greater distance (that is, 105d+105d') from the conductive die pad 120, and may provide the bond pads 111' at a different height relative to the bond pads 111.

The bond pads 111, 111' at different levels or heights may allow for shorter inductance between the passive device 101 and multiple external devices having different heights or thicknesses in the package 300. For example, the thickness 105d of the second layer 105 may provide shorter wirebonds 125 between the bond pads 111 on the upper surface 105a and the bond pads 112 of the active die 102. Also, the thickness 105d' of the first layer 105' may provide shorter wirebonds (not shown) between the bond pads 111' on the upper surface 105a' and the bond pads of another device or structure on or adjacent the die pad 120, such as electrically conductive leads 111f on a package window frame 110f shown in FIGS. 7A to 7C. More generally, the structures (e.g., 105, 105', 315) in accordance with embodiments of the present disclosure can provide bond pads 111, 111' for connection to the passive electronic components 103 at multiple connection levels between the top surface 101a of the passive device 101 and an attachment surface 120.

Figure 4:
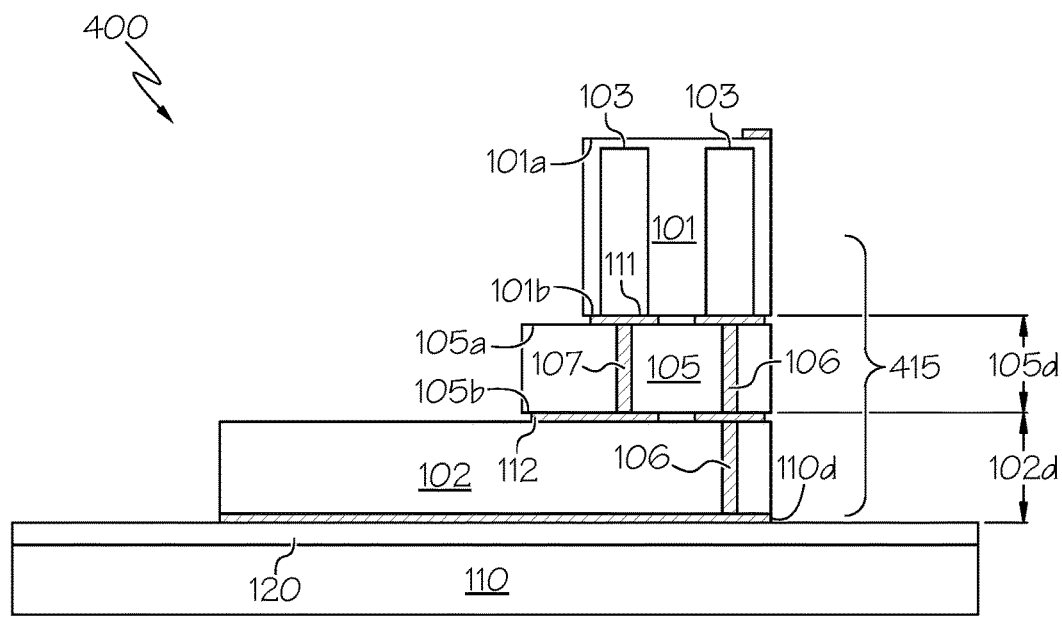

FIG. 4 is a cross-sectional view illustrating an integrated circuit device package 400 including passive RF components with multi-level integrated circuit structures 415 in accordance with some embodiments of the present disclosure. As shown in FIG. 4, the package 400 includes components 101, 102, 105 arranged on a surface (e.g., a conductive die pad 120) of a package substrate 110. The structure 415 includes a lower level (e.g., an intermediate substrate) 105 with the passive device 101 on the upper surface 105a thereof. In the example of FIG. 4, the passive device 101 is on the upper surface 105a the lower level 105, and the lower surface 105b of the lower level 105 is on the surface of the active die 102 having the bond pad 112 thereon. That is, the structure 415 including the passive device 101 and the lower level 105 is stacked on the die pad 120 with the active die 102 therebetween. Respective conductive interconnections 106 extend through the lower level 105 and the active die 102 to electrically connect the passive device 101 to the conductive die pad 120.

Conductive contact elements (e.g., through substrate vias 107) also extend through the lower level 105 to electrically connect the bond pads 111 (which are connected to the one or more passive electronic devices 103) on the surface 105a to the bond pads 112 on the surface of the active die 102. That is, the through substrate vias 107 directly connect the bond pads 111 and 112 without wirebonds 125 therebetween, and a distance between the bond pads 111 and 112 (and thus, the electrical length of the interconnections 107) may be further reduced in comparison to the wirebonds 125.

The thickness 105d of the lower level 105 and a thickness 102d of the active die 102 (that is, the combined thickness 105d+102d) separate the passive components 103 of the upper level 101 from the conductive die pad 120. The thickness 105d of the lower level 105 may thus be designed or selected based on the thickness of the active die 102 to provide the desired distance or clearance between the components 103 of the upper level 101 and the die pad 120 to reduce or avoid capacitive coupling and/or inductor Q reduction, while also providing a more direct connection (with reduced series inductance relative to the lengths of the wirebonds 125) between the bond pads 111 connected to the components 103 of the upper level 101 and the bond pads 112 connected to the components of the active die 102.

Figure 5:
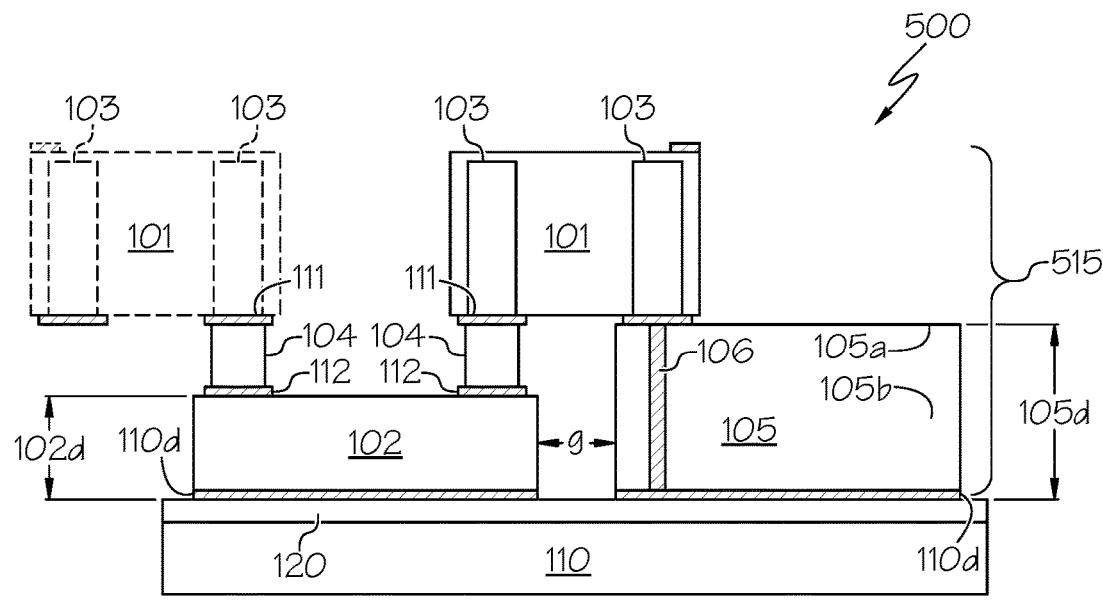

FIG. 5 is a cross-sectional view illustrating an integrated circuit device package 500 including passive RF components with multi-level integrated circuit structures 515 in accordance with some embodiments of the present disclosure. As shown in FIG. 5 the package 500 includes components 101, 102, 105 arranged on a surface (e.g., a conductive die pad 120) of a package substrate 110 with the active die 102 on the conductive die pad 120 adjacent the lower level (illustrated as an intermediate substrate) 105 with the gap g therebetween. In the example of FIG. 5, the upper level or passive device 101 of the structure 515 extends across or "bridges" the gap g between the lower level 105 and the active die 102, thereby further reducing the distance between the bond pads 111 connected to the passive components 103 and the bond pads 112 of the active die 102.

In FIG. 5, the bond pads 112 of the active die 102 are electrically connected to the bond pads 111 of the passive device 101 by respective conductive standoffs 104, rather than wirebonds 125. The lengths or heights of the conductive standoffs 104 may be based on a difference between the thickness 105d of the intermediate substrate 105 and the thickness of 102d of the active die 102, and a distance between the bond pads 111 and 112 (and thus, the electrical length of the interconnections 107) may be further reduced in comparison to the wirebonds 125. That is, the thickness 105d of the lower level 105 and the lengths or heights of the conductive standoffs 104 may be designed or selected based on the thickness of the active die 102 to provide the desired distance or clearance between the components 103 of the upper level 101 and the die pad 120 to reduce or avoid capacitive coupling and/or inductor Q reduction, while also providing a more direct connection (with reduced series inductance relative to the lengths of the wirebonds 125) between the bond pads 111 connected to the components of the upper level 101 and the bond pads 112 connected to the components of the active die 102.

Figure 6:
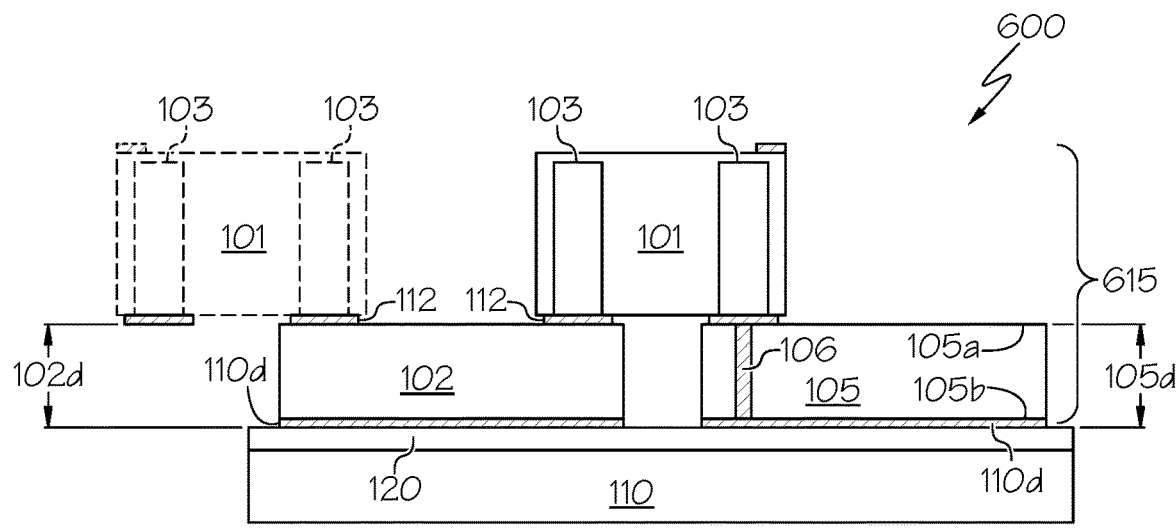

FIG. 6 is a cross-sectional view illustrating an integrated circuit device package 600 including passive RF components with multi-level integrated circuit structures 615 in accordance with some embodiments of the present disclosure. As shown in FIG. 6, the package 600 includes components 101, 102, 105 arranged on a surface (e.g., a conductive die pad 120) of a package substrate 110 with the active die 102 on the conductive die pad 120 adjacent the lower level (illustrated as an intermediate substrate) 105 with a gap g therebetween, as similarly shown in FIG. 5. In the example of FIG. 6, the thickness 105d of the lower level 105 is substantially similar to the thickness 102d of the active die 102, such that the components 103 of the upper level or passive device 101 and the active die 102 are electrically connected to the same bond pads 112. That is, the passive device 101 can be provided directly on the bond pads 112. The thickness 105d of the lower level 105 separates the passive electronic components 103 from a lower surface 105b thereof that is configured to be attached to or is otherwise adjacent the die pad 120, and allows the same bond pad 112 to be connected to both the active electronic components of the active die 102 and the passive electronic components 103 of the passive device 101. That is, a bond pad 112 may be connected to at least one of the active electronic components of the active die 102, and may be directly connected to at least one of the passive electronic components 103 of the passive device 101, without a bond wire and/or a conductive standoff connecting the active die 102 to the passive device 101.

Figure 7A:
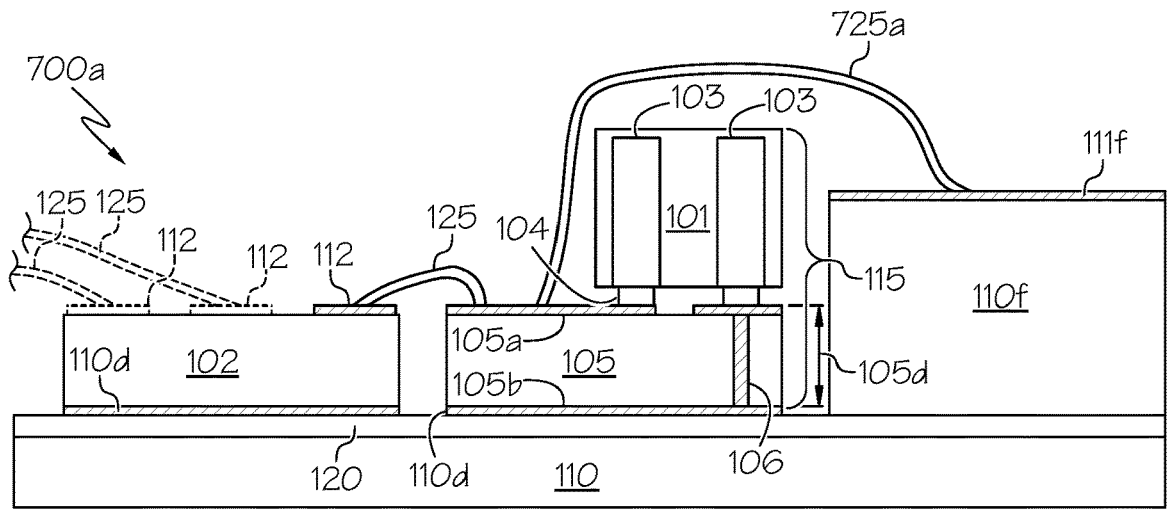
FIGS. 7A, 7B, and 7C are cross-sectional views illustrating examples of wirebond connections for integrated circuit device packages including passive RF components with multi-level integrated circuit structures in accordance with further embodiments of the present disclosure.
Figure 7B:
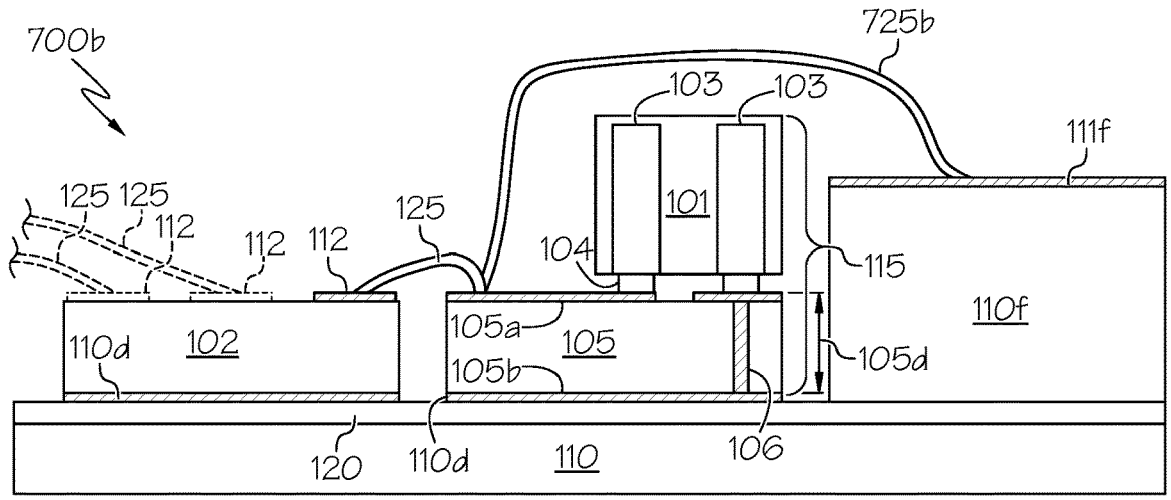
Figure 7C:
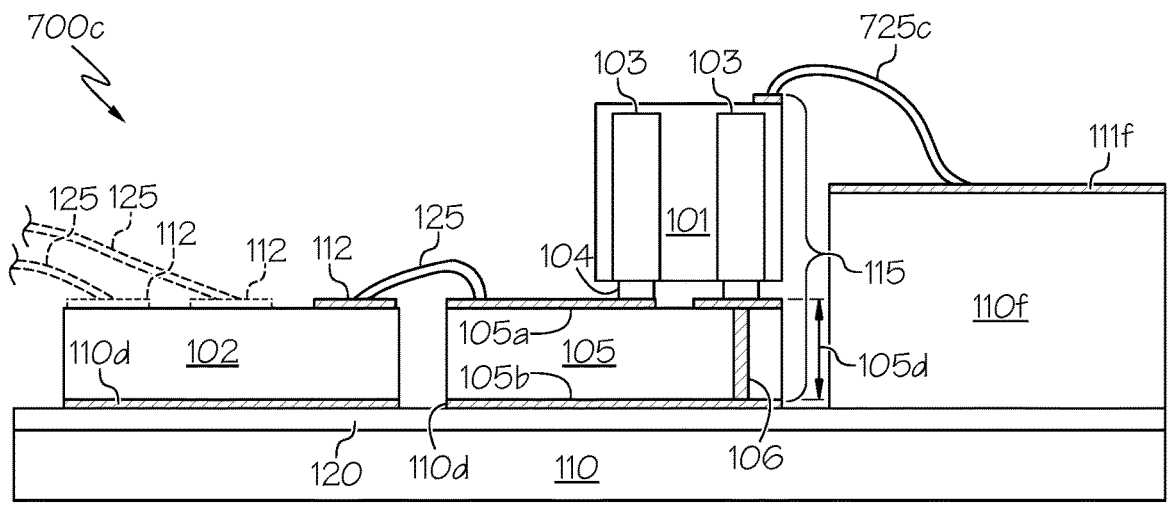

FIGS. 7A, 7B, and 7C are cross-sectional views illustrating examples of input or output connections for integrated circuit device packages including passive RF components with multi-level integrated circuit structures in accordance with further embodiments of the present disclosure. In particular, FIGS. 7A, 7B, and 7C illustrate input or output connections via respective input or output bond pads 111 on the surface 105a of the intermediate substrate 105, input or output connections via stitch bonds, and input or output connections via bond pads 111" on the top surface 101a of the passive device 101, respectively.

FIG. 7A illustrates an example integrated circuit device package 700a where some of the bond pads 111 on the surface 105a of the lower level (illustrated as an intermediate substrate) 105 electrically connect one or more of the passive electronic components 103 of the passive device 101 to the bond pads 112 of the active die 102 via respective wirebonds 125, while others of the bond pads 111 on the surface 105a of the lower level 105 may function as input or output pads for the passive device 101. Respective wirebonds 725a extend over the passive device 101 to electrically connect the input or output pads 111 to another element, illustrated as connections to electrically conductive leads 111f on the package window frame 110f, for example, for connection to one or more external devices. That is, the wirebonds 125 and the wirebonds 725a are connected to different bond pads 111 on the surface 105a of the lower level 105, with the wirebonds 725a extending over the upper surface 101a of the passive device 101.

FIG. 7B illustrates an example integrated circuit device package 700b where a stitch bond connects the same bond pad 111 of the passive device 101 to both a bond pad 112 of the active die 102 and to a conductive lead 111*f* on the package window frame 110*f*. A stitch bond may refer to a bond connection that provides both a first connection (e.g., between bond pad 112 and bond pad 111), and also a second connection (e.g., between bond pad 111 and lead 111*f*), without cutting the bond wire 725*b* such that the second connection can be made with the same wire. In FIG. 7B, respective stitch bonds 725*b* electrically connect one of the bond pads 112 of the active die 102 to one of the bond pads 111 for the passive device 101, and electrically connect the same one of the bond pads 111 of the passive device 101 to one of the leads 111*f* on the package window frame 110*f*.

FIG. 7C illustrates an example integrated circuit device package 700*c* where the passive device 101 includes one or more input or output pads 111" on the upper surface 101*a* thereof. Respective wirebonds 125 electrically connect the bond pads 111 on the surface 105*a* of the lower level (illustrated as an intermediate substrate) 105 to the bond pads 112 of the active die 102, and respective wirebonds 725*c* electrically connect the input or output pads 111" on the upper surface 101*a* of the passive device 101 to leads 111*f* on the package window frame 110*f*. As such, in the embodiments of FIG. 7C, bond wires extending over the passive device 101 may be eliminated, with connections instead provided by the passive components 103 and/or otherwise through the passive device 101 and into or out of the top surface 101*a* via input or output pad 111".

Figure 8A:
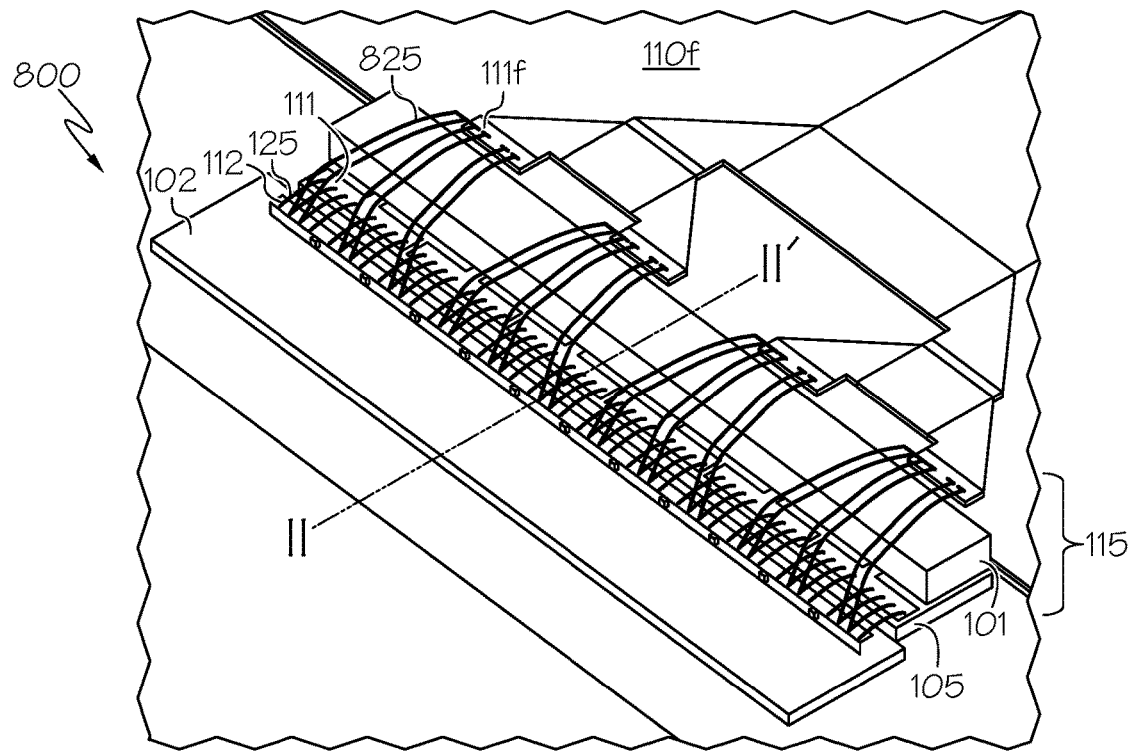
FIGS. 8A and 8B are perspective and cross-sectional views, respectively, illustrating examples of integrated circuit device packages including passive RF components with multi-level integrated circuit structures in accordance with further embodiments of the present disclosure.
Figure 8B:
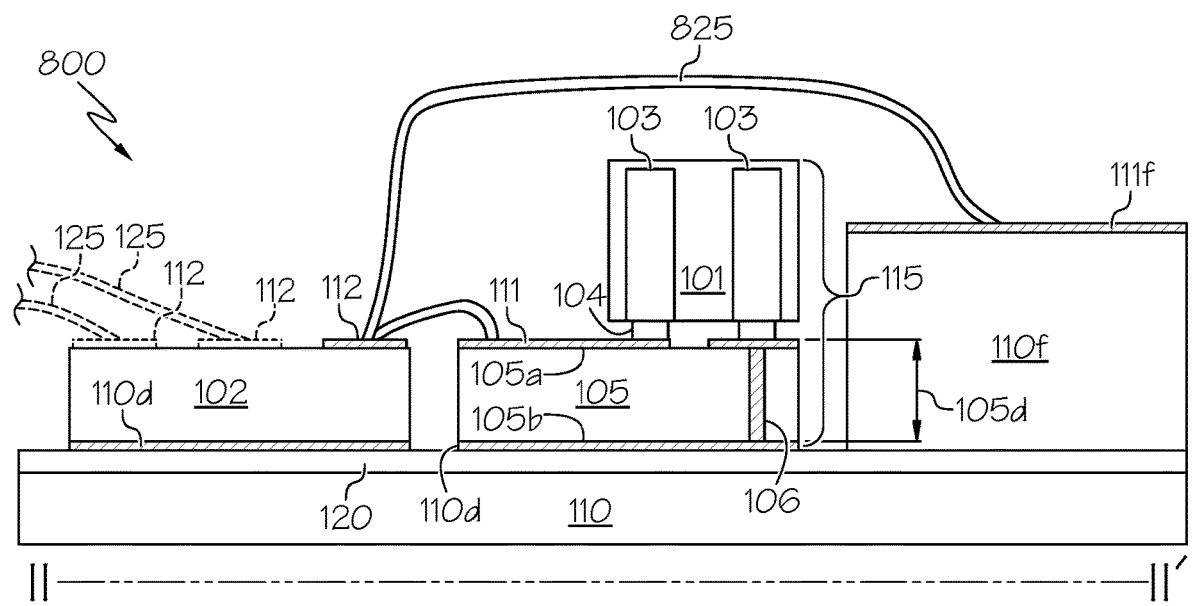

FIG. 8A is a perspective view and FIG. 8B is a cross sectional view (taken along line II-IF of FIG. 8A) illustrating an integrated circuit device package 800 including passive RF components with multi-level integrated circuit structures 115 in accordance with some embodiments of the present disclosure. As shown in FIGS. 8A and 8B, a stitch bond 825 connects the same bond pad 112 of the active die 102 to both a bond pad 111 of the passive device 101 and to a conductive lead 111*f* on the package window frame 110*f*. That is, the stitch bond 825 provides both a first connection (e.g., between bond pad 112 and bond pad 111), and also a second connection (e.g., between bond pad 112 and lead 111*f*), without cutting the bond wire 825 such that the second connection can be made with the same wire. In FIGS. 8A and 8B, respective stitch bonds 825 (which electrically connect one of the bond pads 112 of the active die 102 to one of the bond pads 111 for the passive device 101, and electrically connect the same one of the bond pads 112 of the active die 102 to one of the leads 111*f* on the package window frame 110*f*) are interspersed between respective wire bonds 125 (which electrically connect the bond pads 112 of the active die 102 to the bond pads 111 of the passive device 101).

Figure 9:
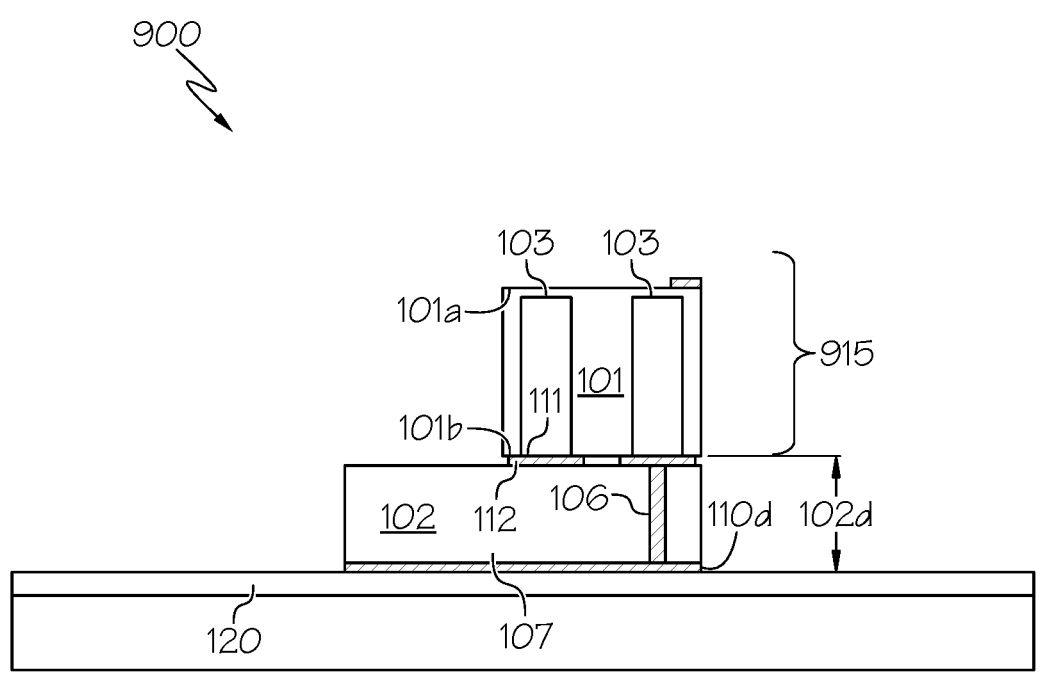
FIG. 9 is a cross-sectional view illustrating an example of an integrated circuit device package including a passive RF component with a multi-level integrated circuit structure in accordance with embodiments of the present disclosure.

FIG. 9 is a cross-sectional view illustrating an example of an integrated circuit device package including a passive RF component with a multi-level integrated circuit structure 915 in accordance with embodiments of the present disclosure. As shown in FIG. 9, the package 900 includes components 101, 102 arranged on a surface (e.g., a conductive die pad 120) of a package substrate 110. In the example of FIG. 9, the passive device or upper level 101 is on the upper surface of the active die 102 contacting the bond pad 112 thereon. That is, the structure 915 including the passive device 101 is stacked on the die pad 120 with the active die 102 therebetween, such that the active die 102 provides the lower level of the structure 915. Conductive interconnections 106 extend through the active die 102 to electrically connect the passive device 101 to the conductive die pad 120. The thickness 102*d* of the active die 102 separates the passive device 101 from a lower surface of the active die 102 that is configured to be attached to or is otherwise adjacent the conductive die pad 120, and may provide the desired distance or sufficient clearance between the components of the passive device 101 and the die pad 120 to reduce or avoid capacitive coupling and/or inductor Q reduction, while also providing a more direct connection (with reduced series inductance relative to the lengths of the wirebonds 125) between the components 103 of the passive device 101 and the bond pads 112 connected to the components of the active die 102.

Any of the multi-level RF integrated circuit components (e.g., 115, 215, 315, 415, 515, 615, 915) described herein may be mounted in a variety of integrated circuit device packages, such as (but not limited to) the package examples shown in FIGS. 10, 11, and 12. Depending on the embodiment, the package can include a monolithic microwave integrated circuit (MMIC) as the active die 102, where the active die 102 incorporates multiple discrete circuits in a single integrated die. Additionally and/or alternatively, the package can comprise multiple active dies 102 in a path that are connected in series to form a multiple stage RF transistor amplifier and/or multiple RF transistor amplifier die that are disposed in multiple paths (e.g., in parallel) to form an RF transistor amplifier with multiple transistor amplifier die and multiple paths, such as in a Doherty amplifier configuration.

FIG. 10 is a cross-sectional view illustrating an example of an over mold-type integrated circuit device package including passive RF components with multi-level integrated circuit structures in accordance with some embodiments of the present disclosure. As shown in FIG. 10, the package 1000 includes components 102, 115 and connections similar to FIGS. 1A and 1B, but mounted on a conductive base or flange 1020 that is configured to provide an electrical ground connection, and with the components 115 coupled to the input and output bond pads 112 of the active die 102 (e.g., to implement input and output matching networks). In the example of FIG. 10, an over mold-type packaging material 1013 substantially surrounds or encapsulates the components 101, 102, 105, while providing access to package RF leads (e.g., gate and drain leads) 1011 via bond wire connections 1025 to the bond pads 112 (e.g., gate and drain pads) of the active die 102 for connection to circuits or devices that are external to the package 1000. The active die 102 (e.g., a source pad of the active die 102) and the lower level 105 of the multi-level integrated circuit structure 115 may be attached to the flange 1020 by respective conductive die attach material layers 110*d*. The flange 1020 may also provide the source lead for the package 1000. In some embodiments, the flange 1020 may provide both an attachment surface for the components 102, 115, as well as thermal conductivity (e.g., a heat sink) for dissipating or otherwise transmitting heat generated by the components outside of the package 1000. The over-mold 1013 may be formed of a plastic or a plastic polymer compound, thereby providing protection from the outside environment. Some advantages of the over mold type packaging material 1013 include reduced overall height or thickness of the package 1000, and design flexibility for the arrangement of and/or spacing between the RF leads 1011.

FIGS. 11 and 12 are cross-sectional views illustrating examples of thermally enhanced integrated circuit device packages including passive RF components with multi-level integrated circuit structures in accordance with some embodiments of the present disclosure. As shown in FIGS. 11 and 12, the open-cavity packages 1100, 1200 include components 102, 115 and connections similar to FIGS. 1A and 1B, but mounted on a conductive base or flange 1120, 1220 and protected by a lid member 1113, 1213 of thermally enhanced packages, with the components 115 coupled to the input and output bond pads 112 of the active die 102 (e.g., to implement input and output matching networks). In particular, FIG. 11 illustrates a first implementation (referred to as an open cavity ceramic package 1100) and FIG. 12 illustrates a second implementation (referred to as an open cavity PCB package 1200) of thermally enhanced packages in accordance with embodiments of the present disclosure.

The open cavity ceramic package 1100 of FIG. 11 may be a ceramic-based package that includes an upper housing defined by a lid member 1113 and a frame member (shown in cross-section as sidewalls 1110f). The lid member 1113 and/or sidewalls 1110f may include ceramic materials (e.g., alumina) and may define an open cavity surrounding the components 102, 115 on the conductive base or flange 1120. The conductive base or flange 1120 provides both an attachment surface for the components 102, 115, as well as thermal conductivity (e.g., a heat sink) for dissipating or otherwise transmitting heat generated by the components outside of the package 1100. The lid member 1113 may be glued to the sidewalls 1110f using an epoxy glue. The sidewalls 1110f may be attached to the base 1120 via braising.

The open cavity PCB package 1200 of FIG. 12 may also be a ceramic-based package that includes a base 1220 and an upper housing with a lid member 1213 and a frame member (shown in cross-section as sidewalls 1210f). The lid member 1213 and sidewalls 1210f similarly define an open cavity surrounding the components 102, 115 on the conductive base or flange 1220, which likewise provides both an attachment surface and thermal conductivity (e.g., a heat sink) for dissipating or otherwise transmitting heat outside of the package 1200. In the package 1200, the lid member 1213 may be a ceramic material (e.g., alumina), while the sidewalls 1210f may be a PCB.

In FIGS. 11 and 12, the flange 1120, 1220 may be an electrically conductive material, for example, a copper layer/laminate or an alloy or metal-matrix composite thereof. In some embodiments, the flange 1120 may include a copper-molybdenum (CuMo) layer, CPC (Cu/MoCu/Cu), or other copper alloys, such copper-tungsten CuW, and/or other laminate/multi-layer structures. In the example of FIG. 11, the flange 1120 may be a CPC-based structure to which the sidewalls 1110f and/or lid member 1113 are attached. In the example of FIG. 12, the flange 1220 may be a copper-molybdenum (RCM60)-based structure to which the sidewalls 1210f and/or lid member 1213 are attached, e.g., by a conductive glue 1208.

In FIGS. 11 and 12, the active die 102 (e.g., a source pad of the active die 102) and the lower level 105 of the multi-level integrated circuit structures 115 may be attached to the flange 1120, 1220 by respective conductive die attach material layers 110d. The flange 1120, 1220 may thus provide the source lead for the package 1100, 1200. Conductive RF leads 1111, 1211 may provide gate and drain leads of the package 1100, and are attached to the flange 1120, 1220 and supported by the respective sidewalls 1110f, 1210f. The thicknesses of the respective sidewalls 1110f, 1210f, may result in a height differential between the components 102, 115 and the package RF leads 1111, 1211 relative to the attachment surface 1120, 1220. In the examples of FIGS. 11 and 12, respective bond wires 1125, 1225 are thus used to connect the package RF leads 1111, 1211 to the bond pads 112 (e.g., the gate and drain pads) of the active die 102 for connection to circuits or devices that are external to the package 1100, 1200. It will be appreciated, however, that the bond wires 1125, 1225 may be omitted in other embodiments and different electrical connections ay be used.

While illustrated in FIGS. 10-12 as including multi-level integrated circuit structures 115 connected to both the input and output of the active die 102 in the packages 1000, 1100, 1200, it will be understood that this configuration is provided by way of example only, and that the multi-level integrated circuit structures 115 may instead be provided at either the input or the output of the active die. Moreover, more than one active die 102 may be included in the packages 1000, 1100, 1200 to implement a multi-stage amplifier, and one or more inter-stage multi-level integrated circuit structures 115 may be connected between active dies 102 to provide inter-stage matching networks, as shown in FIG. 14.

Figure 14:
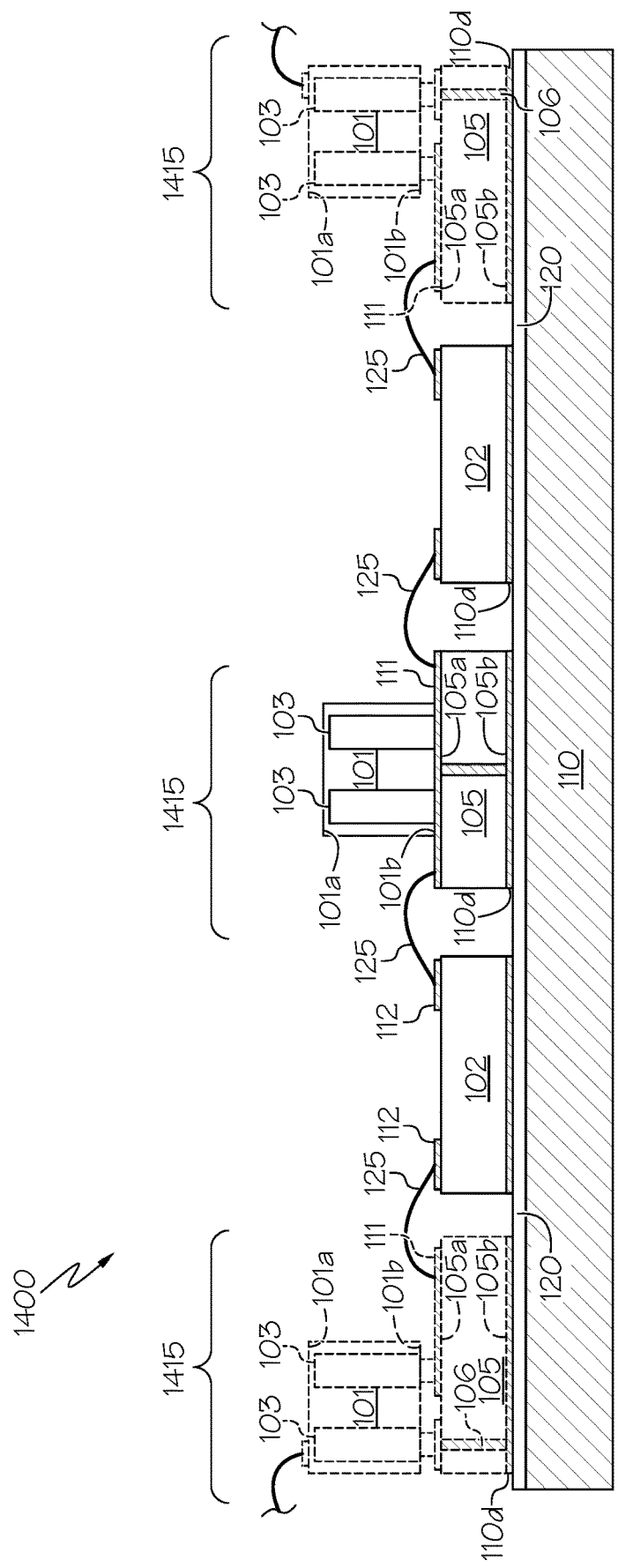
FIG. 14 is a cross-sectional view illustrating an example of an integrated circuit device package including passive RF components with multi-level integrated circuit structures implemented as an inter-stage matching network in accordance with embodiments of the present disclosure.

FIG. 14 is a cross-sectional view illustrating an example of an integrated circuit device package including a passive RF component with a multi-level integrated circuit structure 1415 implemented as an inter-stage matching network in accordance with embodiments of the present disclosure. As shown in FIG. 14, the package 1400 includes components 101, 102 arranged on a surface (e.g., a conductive die pad 120) of a package substrate 110. Conductive interconnections 106 extend through the lower level 105 to electrically connect the passive device 101 to the conductive die pad 120. In the example of FIG. 14, the multi-level integrated circuit structure 1415 is connected to the output (e.g., drain) of a first one of the active dies 102, and to the input (e.g., gate) of a second one of the active dies 102 to define an inter-stage matching network. Additional multi-level integrated circuit structures 1415 (shown in phantom) may also be connected to the input of the first one of the active dies 102 and/or to the output of the second one of the active dies 102 to define input and/or output impedance matching networks, for connection (e.g., by respective bond wires 1025, 1125, 1225) to input and/or output package RF leads (e.g., 1011, 1111, 1211).

Single- or multi-level integrated circuit structures in accordance with further embodiments of the present disclosure are illustrated in FIGS. 15A to 17B. In FIGS. 15A to 17B, the upper level 101 and/or the lower level 105 of the integrated circuit structures may be a non-conductive or dielectric material (e.g., glass, ceramic, plastic, PCB, etc.), such as a three-dimensional (3D) glass-based substrate or intermediate substrate. Also, while shown as a single layer, the upper level 101 and/or the lower level 105 may include one or more distinct layers, or may be a monolithic layer that defines multiple steps or levels. It will be understood that the embodiments of FIGS. 15A to 17B may be implemented in place of or in combination with any of the multi-level integrated circuit structures (e.g., 115, 215, 315, 415, 515, 615, 915) described herein.

Figure 15A:
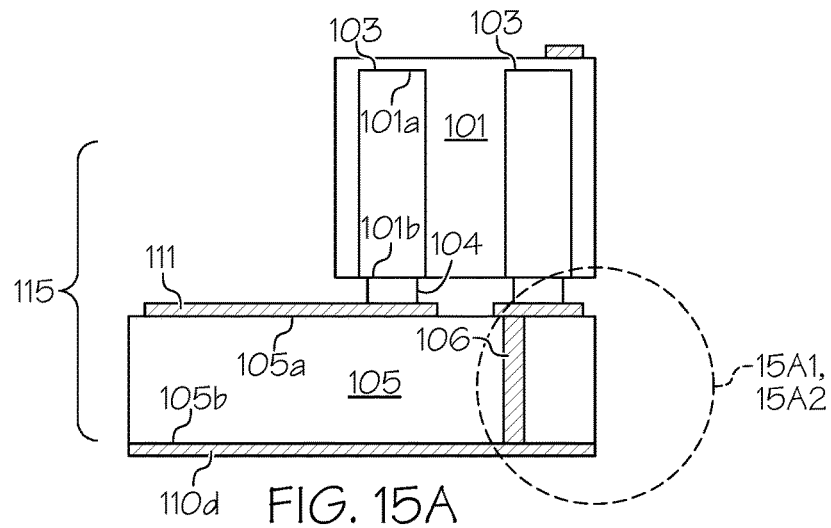
Figure 15C:
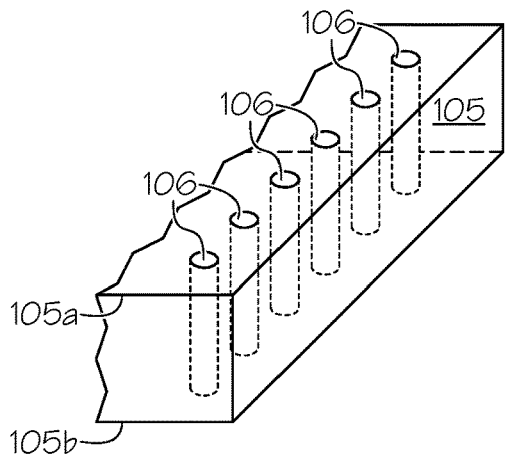
Figure 15C:
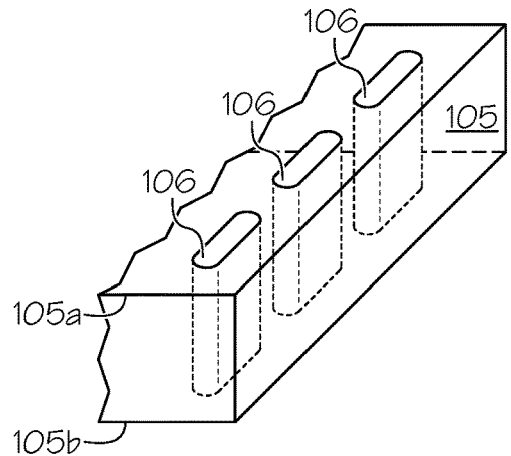
Figure 15C:
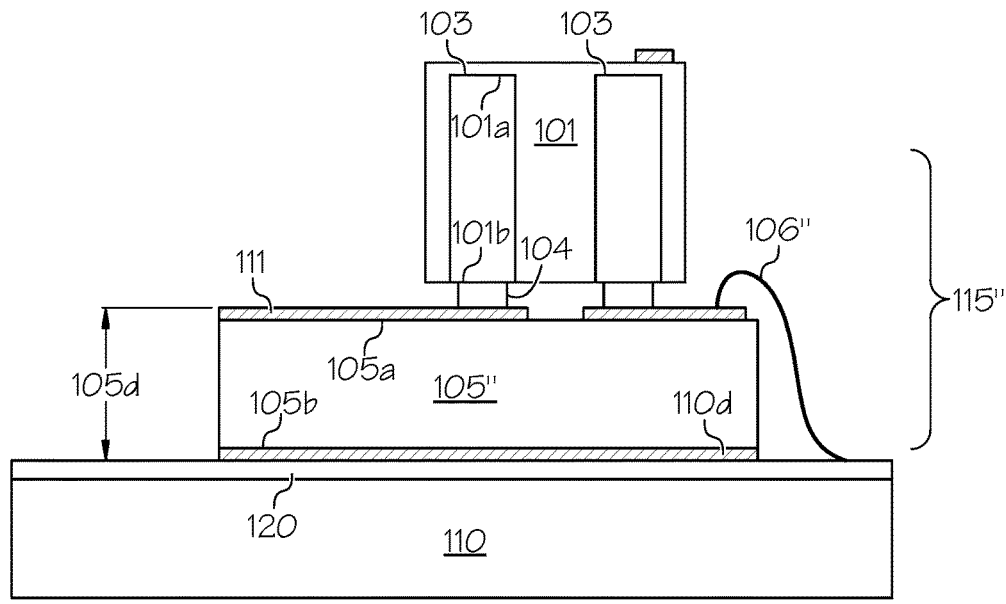

FIGS. 15A, 15B, and 15C are cross-sectional views illustrating examples of conductive interconnections configured to provide electrical connections between levels or surfaces of multi-level integrated circuit structures (e.g., to provide connections to a conductive die pad 120) in accordance with embodiments of the present disclosure. As shown in FIG. 15A, the multi-level integrated circuit structure 115 (e.g., of FIGS. 1A and 1B) may include a plurality conductive interconnections 106 extending through the lower level 105 between the surfaces 105a, 105b to electrically connect the passive components 103 of the upper level 101 to the to the conductive die pad 120. The enlarged perspective view of FIG. 15A1 illustrates the conductive interconnections 106 as a plurality of through substrate vias.

The enlarged perspective view of FIG. 15A2 illustrates the conductive interconnections 106 as a plurality of elongated through substrate vias.

As shown in FIG. 15B, the multi-level integrated circuit structure 115' may include one or more conductive interconnections 106' extending between the surfaces 105a, 105b along an edge of the lower level 105' to electrically connect the passive components 103 of the upper level 101 to the to the conductive die pad 120. The enlarged perspective view of FIG. 15B1 illustrates the conductive interconnections as a plurality conductive edge plates 106' that are spaced apart from one another along the edge of the lower level 105'. The enlarged perspective view of FIG. 15B2 illustrates the conductive interconnection as a single conductive edge plate 106' that extends along up to the entirety of the edge of the lower level 105'.

As shown in FIG. 15C, the multi-level integrated circuit structure 115" may include conductive interconnections implemented by one or more bond wires 106" to electrically connect the passive components 103 of the upper level 101 to the to the conductive die pad 120. As such, the multi-level integrated circuit structure 115" of FIG. 15C may be free of conductive interconnections extending through or along edges of the lower level 105".

FIGS. 16A-16E are plan views illustrating examples of integrated circuit device packages including planar passive RF components with single- or multi-level integrated circuit structures 1615a-1615e in accordance with some embodiments of the present disclosure. In the examples of FIGS. 16A-16E, the integrated circuit structures 1615a-1615e can be connected between a conductive bond pad 112 (e.g., an input, output, and/or ground pad) of an active die 102 and a package RF lead 1611 (or another active die 102'), as shown in phantom, so as to implement input, output, and/or interstage matching circuits.

As shown in FIG. 16A, the multi-level integrated circuit structure 1615a includes one or more conductive traces defining planar passive RF components 1603a1, 1603a2 on the lower level 105. The planar RF components 1603a1, 1603a2 are coupled between the contact pads 111 and the passive components 103 of the upper level 101. In the example of FIG. 16A, the planar RF components are illustrated as spiral inductors 1603a1 and meandered trace inductors 1603a2, but it will be understood that embodiments of the present disclosure may include additional or alternative planar RF component structures than those illustrated. Also, in some embodiments, the upper level 101 and/or the passive components 103 may be omitted.

Figure 16B:
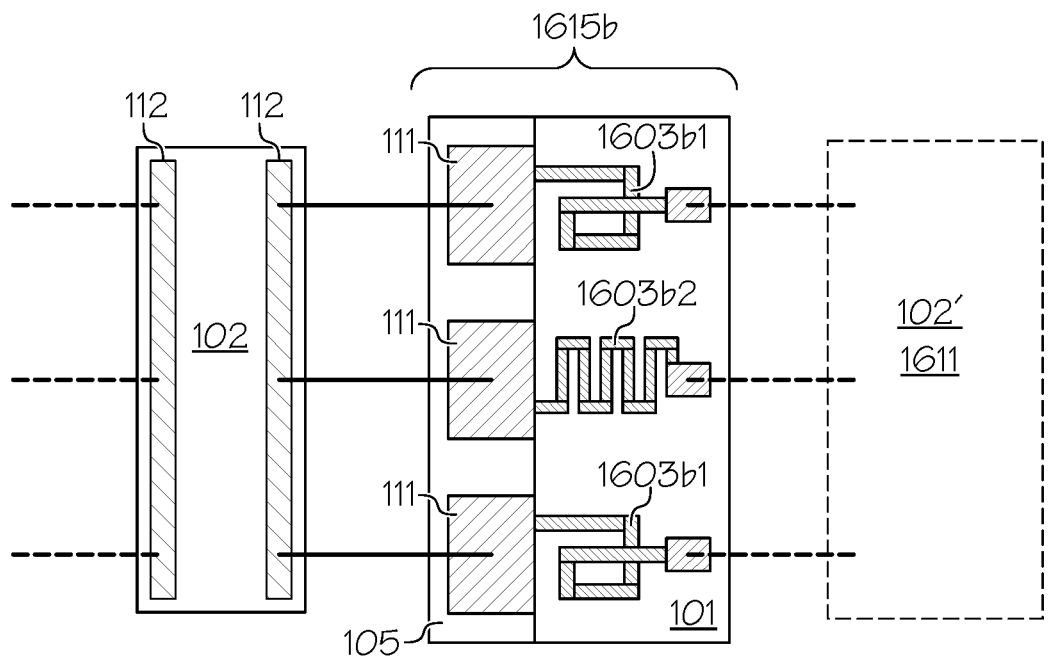

FIG. 16B illustrates an example where the passive components 103 of the upper level 101 are omitted. As shown in FIG. 16B, the multi-level integrated circuit structure 1615b includes one or more conductive traces defining planar passive RF components 1603a1, 1603a2, again illustrated as spiral inductors 1603a1 and meandered trace inductors 1603a2 by way of example. The planar passive RF components 1603a1, 1603a2 are provided in or on the upper level 101 of the structure (e.g., on the upper surface 101a), and are coupled to the contact pads 111 on the lower level 105 by one through substrate vias (not shown).

Figure 16C:
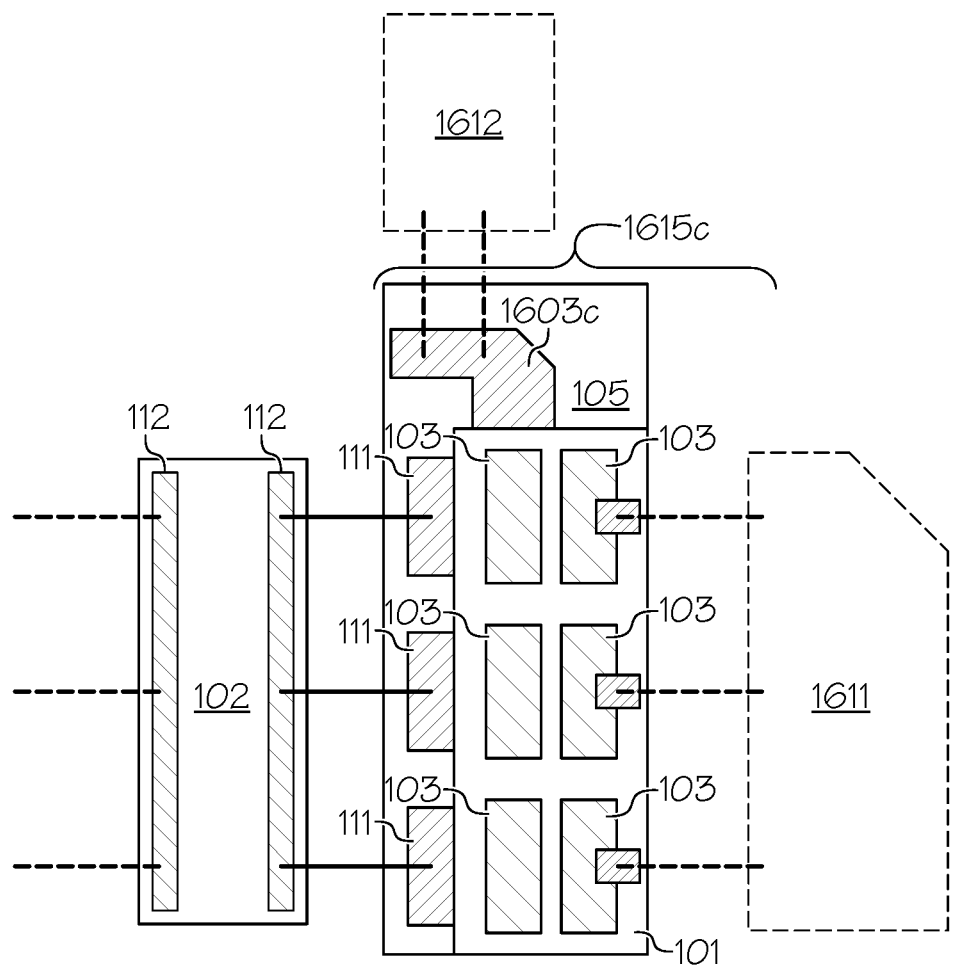

As shown in FIG. 16C, the multi-level integrated circuit structure 1615c includes one or more conductive traces defining a conductive shunt arm 1603c. In the example of FIG. 16C, the shunt arm 1603c may be configured for connection to a non-RF lead 1612 by bond wires. Non-RF leads may refer to electrical connections that provide non-RF signals (i.e., signals having frequencies outside the radio spectrum) for input to and/or output from components of RF transistor amplifier package. For example, the non-RF lead 1612 may carry DC signals to the input (e.g., gate) and/or from the output (e.g., drain) of the active die 102. The passive components 103 of the upper layer 101 are coupled to the contact pads 111 on the lower level 105 (and/or to the conductive shunt arm 1603c) by one through substrate vias (not shown). While illustrated in FIG. 16C with reference to connection to the package RF lead 1611 via the passive components 103 on the upper level, in some embodiments one or more planar RF components (e.g., 1603a1, 1603b1, 1603a2, 1603b2) may be coupled between the package lead 1611 and the active die 102, and the upper level 101 and/or the passive components 103 may be omitted.

Figure 16D:
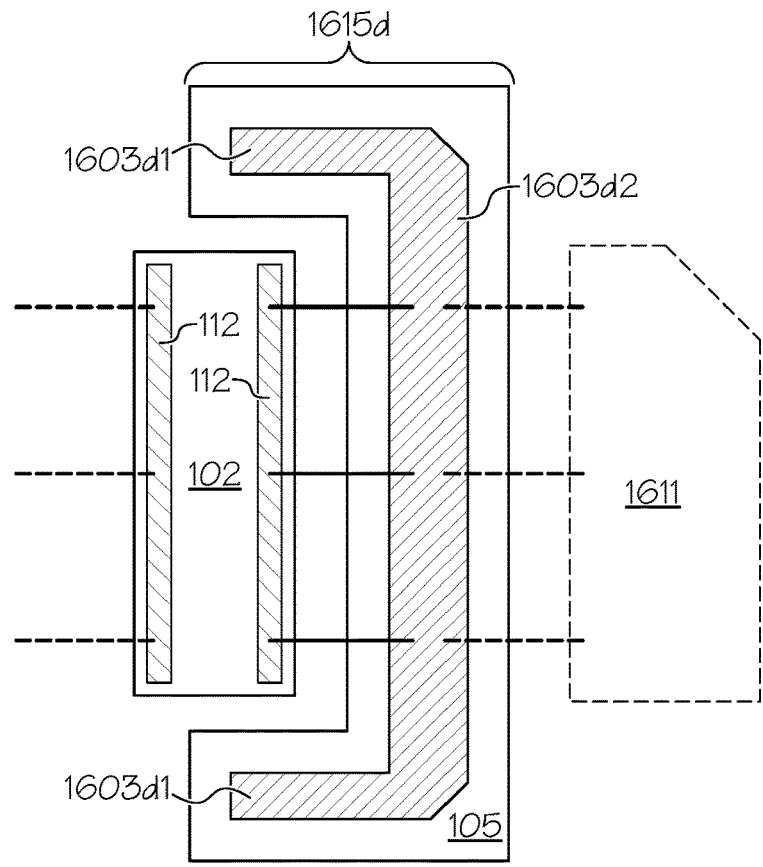

As shown in FIG. 16D, integrated circuit structure 1615d includes one or more conductive traces 1603d1, 1603d2 defining a conductive shunt arm 1603d on the lower level 105. The shunt arm 1603d may be configured for connection to the input/output package RF lead 1611, e.g., defining at least a portion of an impedance matching structure between the active die 102 and the RF lead 1611. In the example of FIG. 16D, the shunt arm 1603d is implemented by planar conductive traces or segments 1603d1 extending along sides of the active die 102, and a planar conductive trace or segment 1603d2 extending between the active die 102 and the package RF lead 1611. However, it will be understood that the illustrated "wrap-around" configuration of the shunt arm 1603d is by way of example only, and that any combination of the side segment(s) 1603d1 or the segment 1603d2 may be present in some embodiments. Also, although illustrated with reference to the shunt arm 1603d on the lower level 105 only, it will be understood that the upper level 101 and/or the passive components 103 may be included in some embodiments, with one or more of the shunt arm segments 1603d1 and/or 1603d2 on the upper level 101.

Figure 16E:
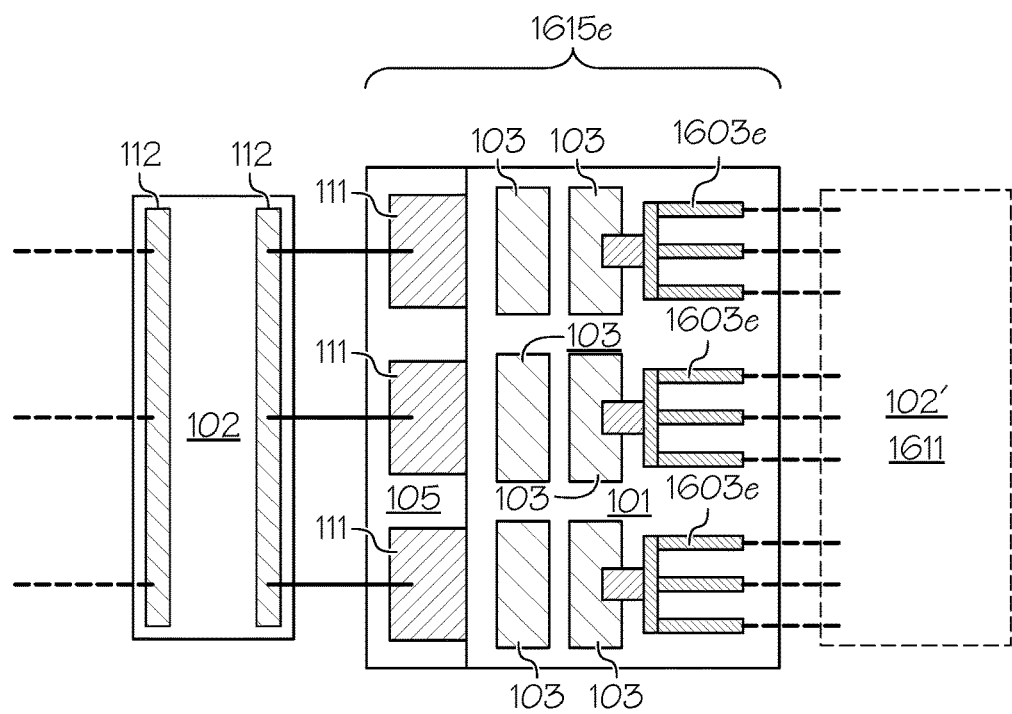

As shown in FIG. 16E, the multi-level integrated circuit structures 1615e includes one or more conductive traces defining transmission line components 1603e. The transmission line components 1603e may extend on the upper level 101 (and/or on the lower level 105) between the active die 102 and the RF package leads 1611 (or between the active die 102 and another active die 102'). For example, the transmission line components 1603e may be configured to compensate for losses introduced by the inclusion of the multi-level integrated circuit structure 1615e, e.g., due to additional or longer wires that may be required to connect the multi-level integrated circuit structure 1615 between the active die 102 and the package lead 1611. The transmission line components 1603e may define stripline components (i.e., where the conductive traces 1603e are internal to or within the upper level 101 and/or the lower level 105) and/or microstrip components (i.e., where the conductive traces 1603e are on external surface(s) 101a and/or 105a of the upper level 101 and/or the lower level 105) extending between the RF package leads 1611 and the active die 102 in some embodiments.

Figure 17A:
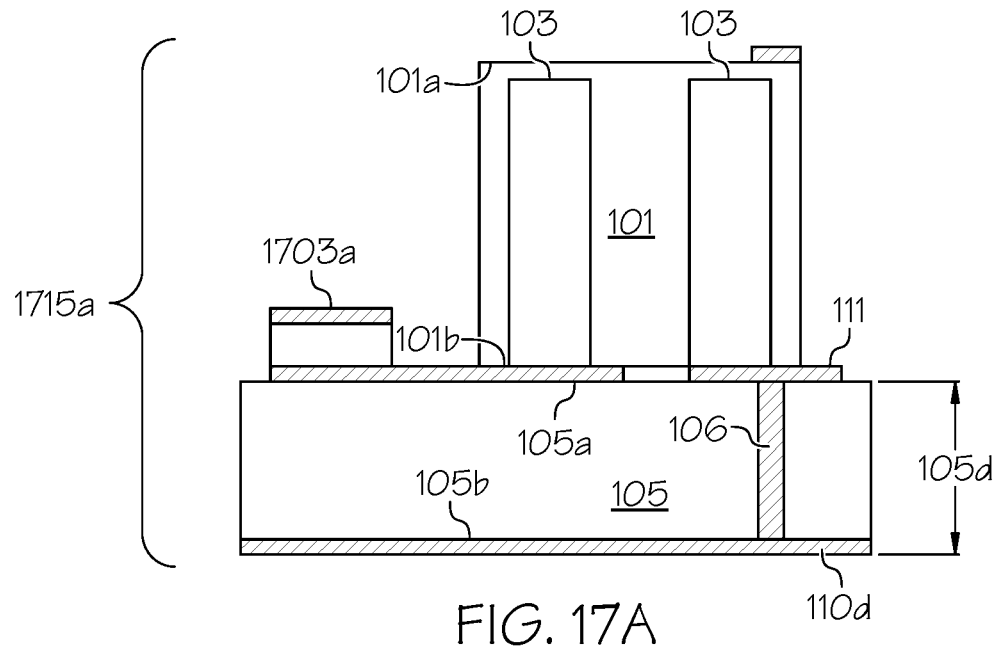
FIGS. 17A and 17B are cross-sectional views illustrating examples of integrated circuit device packages including multi-level integrated circuit structures with integrated capacitor structures in accordance with some embodiments of the present disclosure.
Figure 17B:
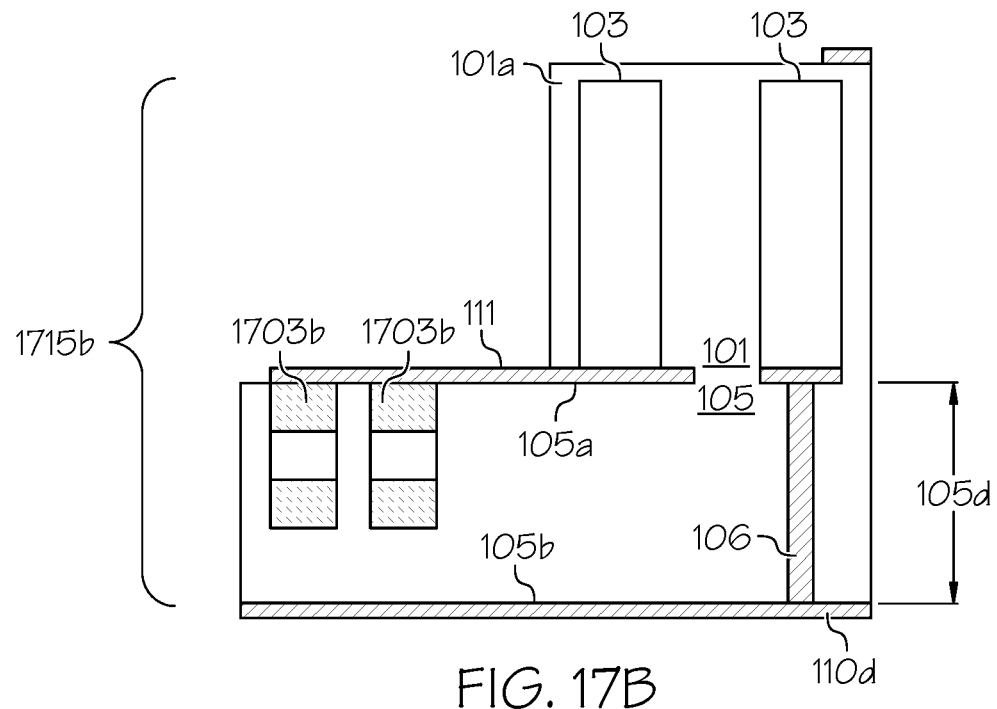

Further embodiments of multi-level integrated circuit structures as described herein may include integrated capacitors, such as high density (HD) metal-insulator-metal (MIM) capacitors. FIGS. 17A and 17B are cross-sectional views illustrating examples of integrated circuit device packages including multi-level integrated circuit structures with integrated capacitor structures in accordance with some embodiments of the present disclosure.

As shown in FIG. 17A, in multi-level integrated circuit structure 1715a, a dielectric layer is provided on a surface of the conductive bond pad 111, and a metal layer is provided on the layer of dielectric material so as to provide a MIM capacitor structure 1703a on the surface 105a of the lower level 105, serially connected to the passive components 103 of the upper level 101. The example of FIG. 17A illustrates the bond pad 111 as the lower electrode of the capacitor 1703a and a series connection with the passive components 103, but it will be understood that embodiments of the present invention are not limited to this implementation, and the capacitor structures 1703a may be implemented as structures that are distinct from the bond pads 111 and/or with any desired electrical connections, in or on any of the levels 101 and/or 105 of the multi-level integrated circuit structure 1715a.

As shown in FIG. 17B, in some embodiments the capacitors may be implemented as three-dimensional structures 1703b in or on the multi-level integrated circuit structure 1715b. In particular, as shown in FIG. 17B, the capacitor structures 1703b, each of which includes metal layers and a dielectric material layer therebetween, are provided within the lower level 105 of the multi-level integrated circuit structure 1715b, extending between the surfaces 105a, 105b. The capacitor structures 1703b may be connected with the passive components 103 by any desired electrical connection. Also, while illustrated in the lower level 105 of the multi-level integrated circuit structure 1715b, it will be understood that embodiments of the present invention are not limited to this implementation, and the capacitor structures 1703b may be implemented in the upper level 101 (e.g., as shown in FIGS. 1A and 1B in embodiments where the passive components 103 are capacitors) and/or the lower level 105 of the multi-level integrated circuit structure 1715b.

More generally, multi-level integrated circuit structures as described herein may include any combination of multiple levels of passive components (e.g., resistors, inductors, and/or capacitors), in two-dimensional (e.g., planar) and/or three-dimensional configurations of the passive components, in and/or on a non-conductive monolithic or discrete-layer stacked level structure.

In any of the embodiments described herein, the upper level 101 and/or lower level 105 of the passive RF components may include holes, voids, or other cavities therein, which can be used to increase inductance quality and/or to provide capacitance. For example, the lower level 105, the upper level 101, and/or level(s) therebetween may define a three-dimensional glass structure including a plurality of voids between the upper surface 105a and lower surface 105b thereof, which may increase the quality factor Q of inductor(s) 103 in the upper level 101.

FIGS. 13A-13F are enlarged views more generally illustrating various configurations of RF integrated circuit components 1315a-1315f (collectively 1315) including holes or voids 1399 therein that may improve inductance in accordance with some embodiments of the present disclosure. In FIGS. 13A-13F, the RF integrated circuit components 1315 each include a body 1390 that is formed of a non-conductive or dielectric material (e.g., glass, ceramic, plastic, PCB, etc.) and includes conductive elements 1303a, 1303b (collectively 1303) defining discrete electronic components (e.g., passive components such as reactive components (inductors, capacitors) and/or resistors), and at least one void 1399 in the body 1390 that defines a portion of or otherwise contributes to characteristics of the discrete electronic components. In some embodiments, the non-conductive material body 1390 may be a glass layer or three-dimensional glass structure including the conductive elements 1303 embedded therein or otherwise surrounding the discrete electronic components. The void 1399 can be fully surrounded by dielectric material body 1390, or may be a cavity in or partially surrounded by the dielectric material body 1390. The size and/or density of the void(s) (including one or more holes and/or cavities) 1399 in the body 1390 can improve inductance by reducing capacitance of the discrete electronic components. The discrete electronic components may define at least a portion of an input, inter-stage, or output impedance matching circuit or a harmonic termination circuit for a RF power amplifier.

Figure 13A:
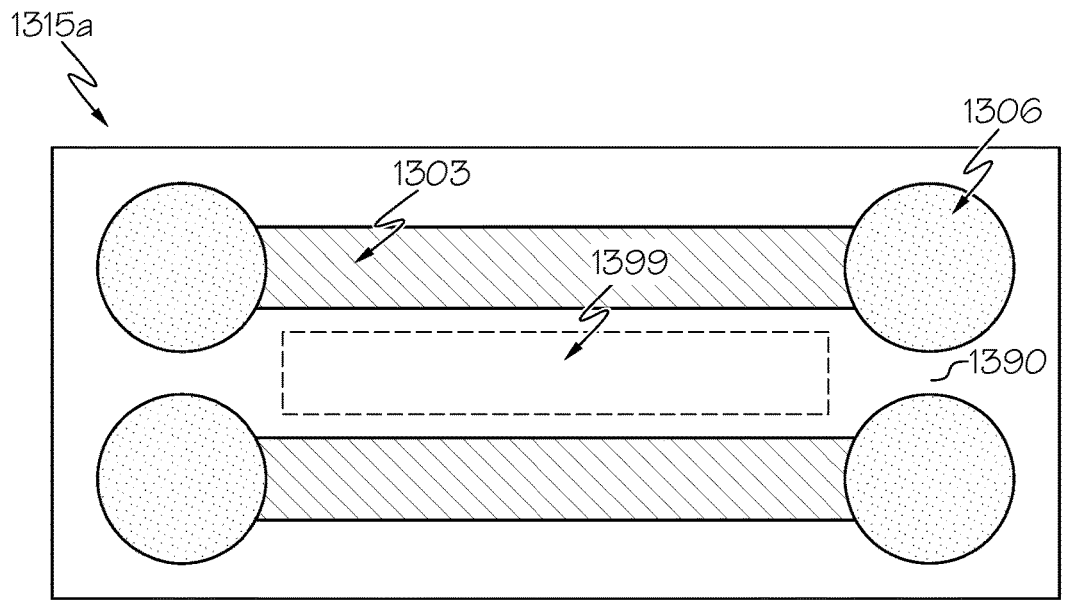
FIGS. 13A, 13B, 13C, 13D, 13E and 13F are enlarged views illustrating various configurations of holes or cavities or other voids that may improve inductance in RF integrated circuit components in accordance with some embodiments of the present disclosure.

In particular, FIG. 13A is a top or plan view illustrating an RF component 1315a including a single open cavity or void 1399 in dielectric or non-conductive material body 1390. In the example of FIG. 13A, the conductive elements 1303a defining the discrete electronic components are illustrated as inductor coil traces on a same level, with conductive through substrate vias 1306 providing respective electrical connections to the elements 1303a.

Figure 13B:
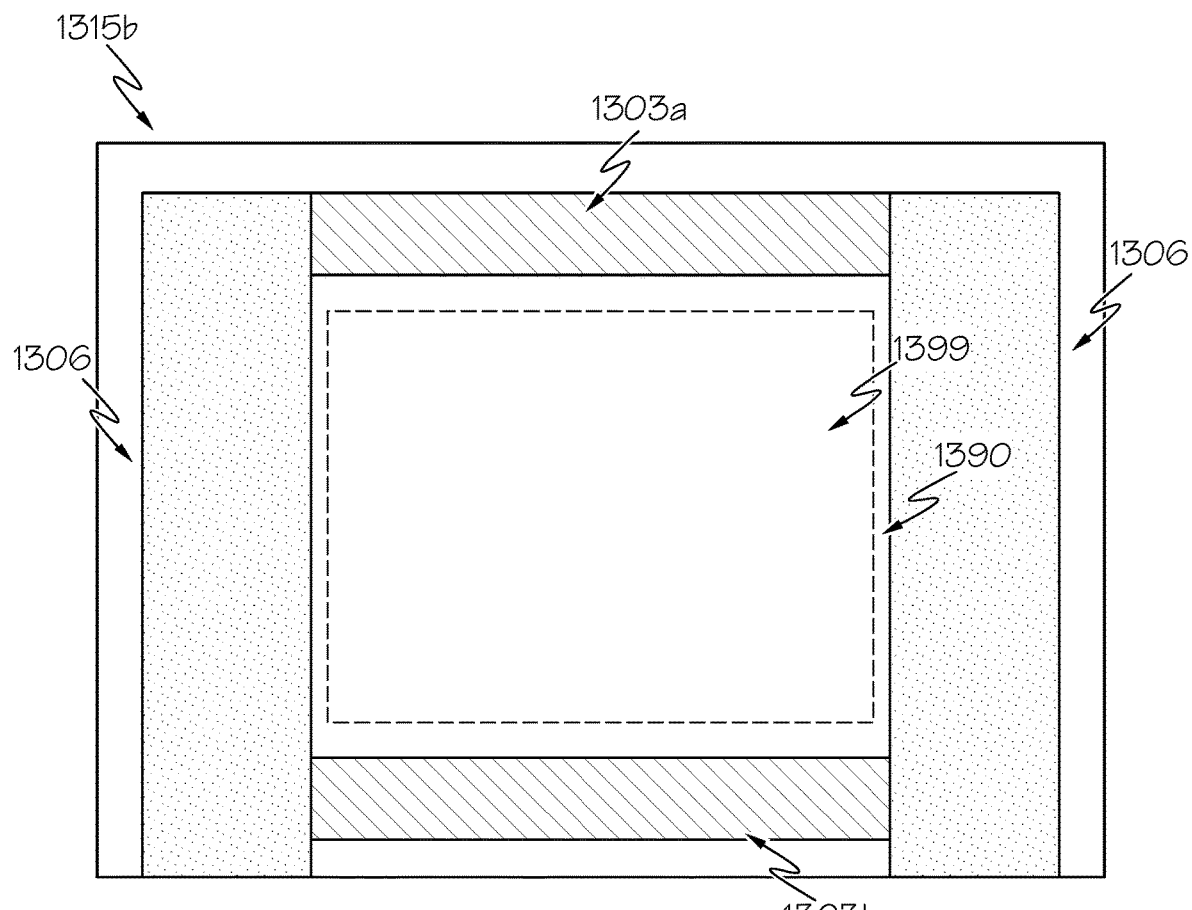

FIG. 13B is a side view illustrating an RF component 1315b including a single open cavity or void 1399 in a dielectric or non-conductive material body 1390. The void 1399 extends between conductive elements 1303a on an upper level and conductive elements 1303b in or on a lower level, with conductive through substrate vias 1306 providing electrical connections to the conductive elements 1303a, 1303b of the different levels. In the example of FIG. 13B, the non-conductive material 1390 defines a level or layer between the upper level including the conductive elements 1303a, and the lower level including the conductive elements 1303b. For example, the conductive elements 1303a and 1303b may define upper and lower layer inductor coil traces, respectively.

Figure 13C:
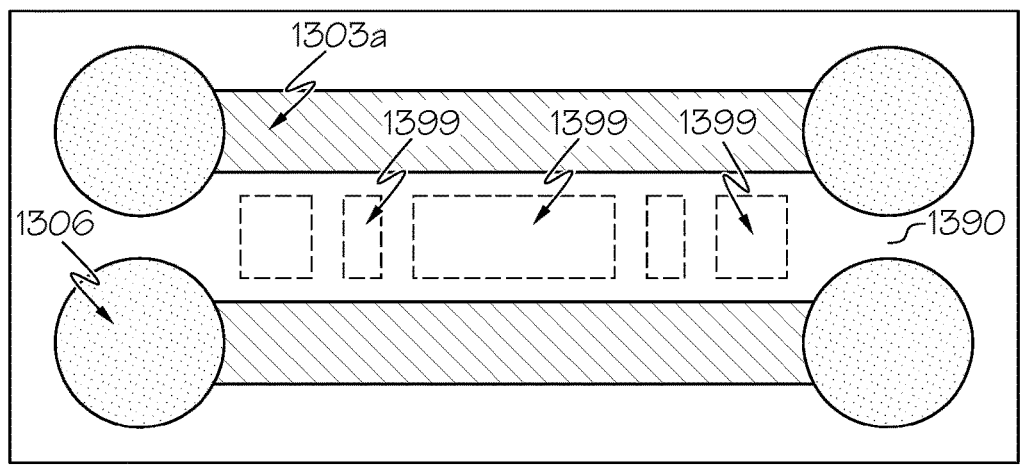
Figure 13D:
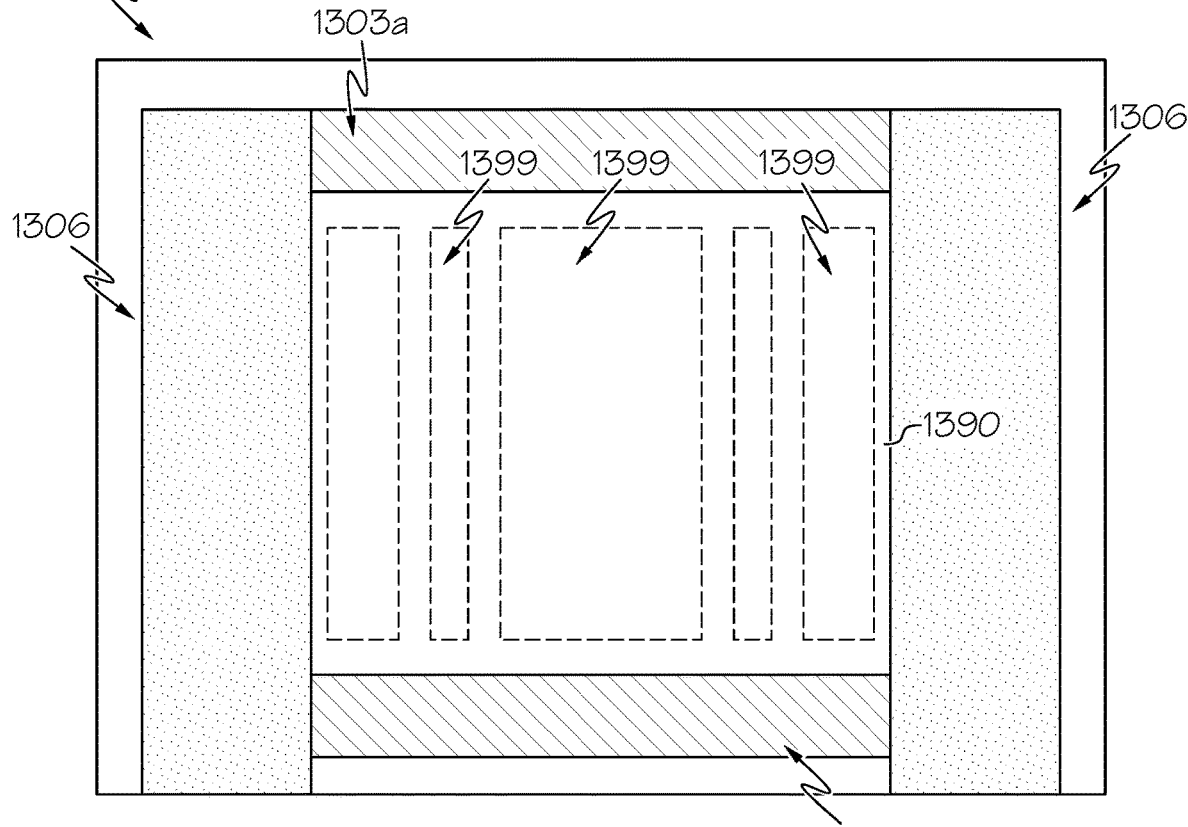

FIG. 13C is a top or plan view illustrating an RF component 1315c including multiple voids 1399 in dielectric or non-conductive material body 1390 between conductive elements 1303a on a same level, with conductive through substrate vias 1306 providing respective electrical connections to the conductive elements 1303a. FIG. 13D is a side view illustrating an RF component 1315d including multiple voids 1399 in dielectric or non-conductive material body 1390 between upper and lower layer conductive elements 1303a and 1303b, respectively. In FIGS. 13C and 13D, the voids 1399 are illustrated as differing in size and/or dimensions, but it will be understood that manufacturing requirements may necessitate consistent design rules for the voids and/or spacing requirements between voids 1399. That is, while illustrated in FIGS. 13C and 13D as differing in size, some embodiments may include repetition of multiple voids 1399 having a same or consistent void size, with a consistent amount or thickness of the dielectric material 1390 between the voids.

Figure 13E:
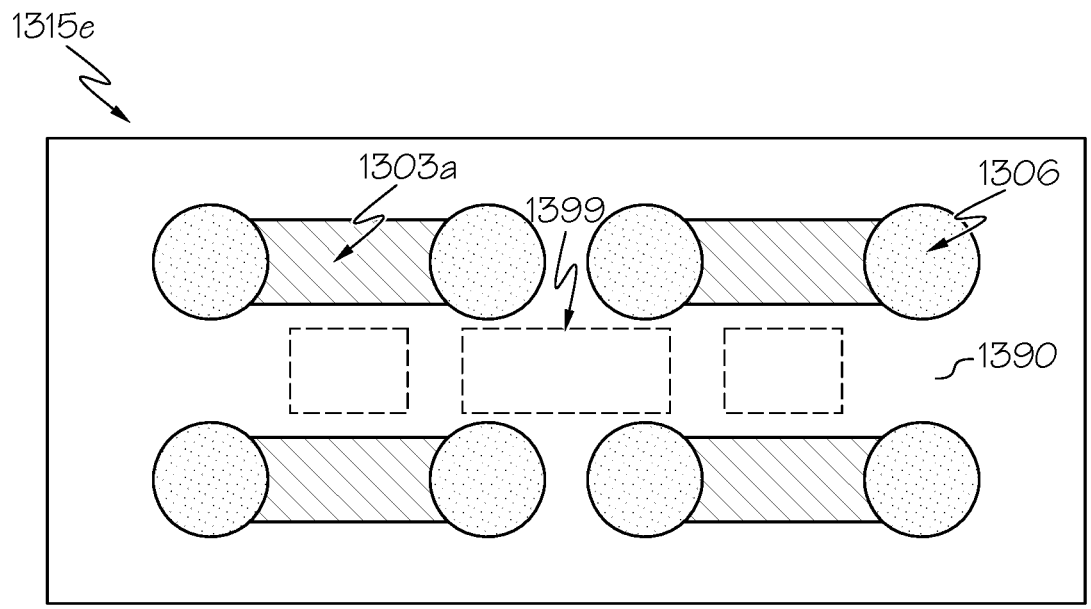
Figure 13F:
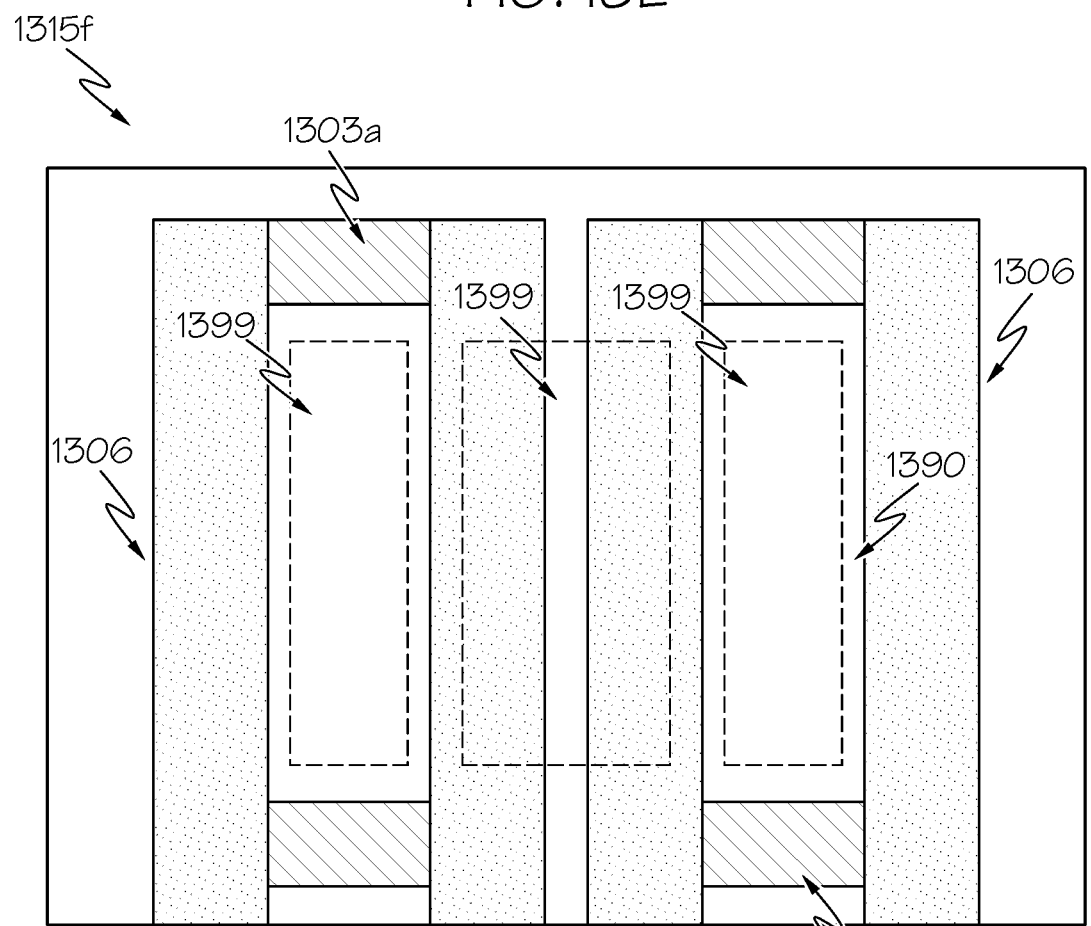

FIG. 13E is a top or plan view illustrating an RF component 1315e including multiple voids 1399 in dielectric or non-conductive material body 1390 between conductive elements 1303a on a same level, with conductive through substrate vias 1306 providing respective electrical connections to the elements 1303a. FIG. 13F is a side view illustrating an RF component 1315f including multiple voids 1399 in dielectric or non-conductive material body 1390 between upper and lower layer conductive elements 1303a and 1303b, respectively. In FIGS. 13E and 13F, similar size voids 1399 are provided between the conductive elements 1303a on the same level, and between the conductive elements 1303a, 1303b of the different levels, respectively, with larger voids 1399 extending between elements 1303a and/or 1303b connected by conductive through substrate vias 1306.

While illustrated primarily with reference to embodiments including multiple distinct upper and lower levels, it will be understood that in some embodiments a unitary or monolithic stepped structure (with at least one inductor in an upper step or level 101 and one or more electrical connections, capacitors, and/or active components in a lower step or level 105 that is between the upper level 101 and the connection to the conductive die pad) may be used to implement the multi-level passive RF components described herein.

As described in detail herein, embodiments of the present disclosure provide a passive device or die (such as an IPD) including passive electronic components, such as one or more inductor coils, where the bond pads that provide electrical connections to the inductor coils are closer to the attachment surface (e.g., a die pad of a package substrate) than the inductor coils. This configuration can simultaneously provide both shorter connection distances between the bond pads of the passive device to bond pads of an active die (to minimize series inductance), and increased vertical distance or separation between the inductor coil(s) of the passive device and a die pad/ground plane/flange on which the active die is attached (to minimize negative effects on the quality factor Q of the inductor coils).

In particular embodiments, a lower level (such as an intermediate substrate or structure, e.g., glass, ceramic, plastic, PCB, etc.) including one or more step differences is positioned between a passive device and the conductive die pad to increase a distance between the passive components of the passive device and the die pad, and to reduce a distance between the bond pads of the passive device and the bond pads of the active die. The intermediate substrate or other lower level can be external to or integrated with the passive device or upper level. The lower level may be free of inductors in some embodiments, but may include other electrical components, such as transistors, capacitors, and/or resistive elements. Some embodiments may be used to implement RF power amplifier internal matching networks, and/or other applications where a short series inductance to an adjacent die is desired. More generally, embodiments of the present disclosure may be used in any chip and wire solution in which a minimal inductance connection in combination with a high Q spiral inductor is desired.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A multi-level radio frequency (RF) integrated circuit component, comprising:
   an upper level comprising at least one inductor; and
   a lower level comprising at least one conductive element that provides electrical connection to the at least one inductor, wherein the lower level separates the at least one inductor from a lower surface that is configured to be attached to a conductive pad, and the at least one conductive element is on an external surface of the multi-level RF integrated circuit component that is distinct from the lower surface.

2. The multi-level RF integrated circuit component of claim 1, wherein the external surface is an upper surface of the lower level that is opposite the lower surface, wherein the at least one conductive element comprises:
   a contact pad on the upper surface of the lower level;
   a conductive through via extending between the upper surface and the lower surface of the lower level; and/or
   a conductive edge plate extending along an edge of the lower level between the upper surface and the lower surface thereof.

3. The multi-level RF integrated circuit component of claim 2, wherein the lower level comprises a non-conductive material having the at least one conductive element thereon and/or therein, and is free of inductors.

4. The multi-level RF integrated circuit component of claim 3, wherein the lower level comprises one or more voids in the non-conductive material.

5. The multi-level RF integrated circuit component of claim 1, wherein the lower level comprises at least one capacitor.

6. The multi-level RF integrated circuit component of claim 1, wherein the lower level comprises at least one active electronic component.

7. The multi-level RF integrated circuit component of claim 1, wherein the lower level comprises first and second levels defining a stepped structure, wherein the second level comprises the lower surface.

8. The multi-level RF integrated circuit component of claim 1, wherein the upper level comprises an integrated passive device (IPD) including the at least one inductor, and the lower level comprises an intermediate substrate including the lower surface.

9. The multi-level RF integrated circuit component of claim 1, wherein the upper level and the lower level collectively define an integrated passive device (IPD) including the at least one inductor.

10. The multi-level RF integrated circuit component of claim 9, wherein the upper level and the lower level define a monolithic structure.

11. The multi-level RF integrated circuit component of claim 1, wherein the multi-level RF integrated circuit component is free of active electronic components.

12. The multi-level RF integrated circuit component of claim 1, wherein the at least one inductor of the upper level defines at least a portion of an input, inter-stage, or output impedance matching circuit or harmonic termination circuit for a RF power amplifier.

13. A multi-level radio frequency (RF) integrated circuit component, comprising:
   an upper level comprising at least one inductor; and
   a lower level comprising at least one conductive element that provides electrical connection to the at least one inductor, wherein the lower level separates the at least one inductor from a lower surface that is configured to be attached to a conductive pad,
   wherein the lower level comprises a non-conductive material having the at least one conductive element thereon and/or therein, and the non-conductive material comprises a three-dimensional glass structure that is between the at least one inductor and the lower surface.

14. An integrated circuit device package, comprising:
   a package substrate comprising a conductive attachment surface; and
   a multi-level radio frequency (RF) integrated circuit component on the conductive attachment surface, the multi-level RF integrated circuit component comprising:
      an upper level comprising at least one inductor; and
      a lower level comprising at least one conductive element that provides electrical connection to the at least one inductor, wherein the lower level separates the at least one inductor from the conductive attachment surface, and the at least one conductive element is on an external surface of the multi-level RF integrated circuit component,
   wherein the at least one conductive element comprises a contact pad on an upper surface of the lower level, a conductive through via extending between the upper surface and a lower surface of the lower level adjacent the conductive attachment surface, and/or a conductive edge plate extending along an edge of the lower level between the upper surface and the lower surface thereof.

15. The integrated circuit device package of claim 14, wherein the at least one conductive element is at least one first conductive element, and further comprising:
   an active die on the conductive attachment surface, the active die comprising a plurality of transistor cells and at least one second conductive element electrically connected to one or more of the transistor cells,
   wherein the at least one second conductive element is electrically connected to the at least one first conductive element.

16. The integrated circuit device package of claim 15, wherein the at least one second conductive element comprises an input pad for the one or more of the transistor cells of the active die.

17. The integrated circuit device package of claim 15, wherein the at least one second conductive element comprises an output pad for the one or more of the transistor cells of the active die.

18. The integrated circuit device package of claim 15, wherein the at least one second conductive element comprises an input pad and an output pad for the one or more of the transistor cells of the active die.

19. The integrated circuit device package of claim 15, wherein the lower level is stacked on the conductive attachment surface with the active die therebetween.

20. The integrated circuit device package of claim 15, wherein the active die is on the conductive attachment surface adjacent the lower level with a gap therebetween, and wherein the upper level bridges the gap.

21. The integrated circuit device package of claim 15, wherein the multi-level RF integrated circuit component comprises an output pad electrically connected to the at least one inductor, and further comprising:
   a frame member adjacent the lower level on the conductive attachment surface, the frame member comprising a package lead; and
   a wirebond that extends adjacent the upper level and electrically connects the output pad to the package lead.

22. The integrated circuit device package of claim 15, wherein the at least one second conductive element comprises a ground pad that is configured to provide an electrical ground connection for the one or more of the transistor cells of the active die.

23. The integrated circuit device package of claim 13, wherein the multi-level RF integrated circuit component is free of active electronic components.

24. The integrated circuit device package of claim 14, wherein the upper level comprises an integrated passive device (IPD) including the at least one inductor, and the lower level comprises an intermediate substrate defining a step difference that separates the at least one inductor from the conductive attachment surface.

25. The integrated circuit device package of claim 14, wherein the upper level and the lower level collectively define an integrated passive device (IPD) including the at least one inductor.

26. An integrated circuit device package, comprising:
a package substrate comprising a conductive attachment surface;
a multi-level radio frequency (RF) integrated circuit component on the conductive attachment surface, the multi-level RF integrated circuit component comprising an upper level comprising at least one inductor and a lower level comprising at least one first conductive element that provides electrical connection to the at least one inductor, wherein the lower level separates the at least one inductor from the conductive attachment surface; and
an active die on the conductive attachment surface, the active die comprising a plurality of transistor cells and at least one second conductive element electrically connected to one or more of the transistor cells, wherein the at least one second conductive element is electrically connected to the at least one first conductive element,
wherein the active die is on the conductive attachment surface adjacent the lower level, wherein the first and second conductive elements are first and second bond pads, and further comprising:
a wirebond electrically connecting the second bond pad to the first bond pad.

27. An integrated circuit device package, comprising:
a package substrate comprising a conductive attachment surface;
a multi-level radio frequency (RF) integrated circuit component on the conductive attachment surface, the multi-level RF integrated circuit component comprising an upper level comprising at least one inductor and a lower level comprising at least one first conductive element that provides electrical connection to the at least one inductor, wherein the lower level separates the at least one inductor from the conductive attachment surface; and
an active die on the conductive attachment surface, the active die comprising a plurality of transistor cells and at least one second conductive element electrically connected to one or more of the transistor cells, wherein the at least one second conductive element is electrically connected to the at least one first conductive element,
wherein the transistor cells of the active die define a RF power amplifier, and wherein the at least one inductor defines at least a portion of an input, inter-stage, or output impedance matching circuit or harmonic termination circuit for the RF power amplifier.

28. A radio frequency (RF) integrated circuit component, comprising:
a body of dielectric material;
conductive elements defining at least one discrete electronic component in the body of dielectric material; and
at least one void in the body of dielectric material and defining a portion of the at least one discrete electronic component.

29. The RF integrated circuit component of claim 28, wherein the at least one discrete electronic component is free of active electronic components.

30. The RF integrated circuit component of claim 28, wherein the at least one void is at least partially surrounded by the body of dielectric material.

31. The RF integrated circuit component of claim 28, wherein the body of dielectric material comprises glass, ceramic, or plastic.

32. The RF integrated circuit component of claim 28, wherein the at least one discrete electronic component comprises at least one of an inductor, a capacitor, or a resistor.

33. The RF integrated circuit component of claim 32, wherein the at least one discrete electronic component defines at least a portion of an input, inter-stage, or output impedance matching circuit or a harmonic termination circuit for a RF power amplifier.

34. The RF integrated circuit component of claim 28, wherein the body of dielectric material comprises a first level and a second level on the first level, wherein the at least one discrete electronic component is in or on one of the first or second levels, and wherein at least one of the first level, the second level, or a level therebetween comprises the at least one void therein.

35. A multi-level radio frequency (RF) integrated circuit package, comprising:
a substrate; and
a multi-level integrated device on the substrate, the multi-level integrated device comprising a first level, a second level, and a conductive contact element, wherein the second level comprises a discrete electronic component comprising a reactive component that is electrically connected to the conductive contact element and is separated from the substrate by the first level,
wherein the conductive contact element is on an external surface of the multi-level integrated device that is distinct from a lower surface thereof that is attached to the substrate, and is electrically connected to at least one of matching circuitry, harmonic termination circuitry, an active transistor die, or a package lead.

36. The multi-level RF integrated circuit package of claim 35, wherein the conductive contact element is between an upper surface of the multi-level integrated device and the lower surface thereof.

37. The multi-level RF integrated circuit package of claim 36, wherein the discrete electronic component is a second discrete electronic component, and wherein the first level comprises a first discrete electronic component and is free of inductors.

38. The multi-level RF integrated circuit package of claim 37, wherein the conductive contact element comprises first and second conductive contact elements that are electrically connected to the first and second discrete electronic components, respectively,
wherein each of the first and second conductive contact elements is electrically connected to at least one of the matching circuitry, the harmonic termination circuitry, the active transistor die, or the package lead.

39. The multi-level RF integrated circuit package of claim 35, wherein the discrete electronic component comprises a planar passive RF component.

40. The multi-level RF integrated circuit package of claim 35, wherein at least one of the first or second levels comprises one or more conductive transmission line components therein or thereon, the conductive transmission line components comprising at least one of a stripline or a microstrip.

41. The multi-level RF integrated circuit package of claim 35, wherein the conductive contact element is at least one first conductive contact element, and further comprising:
the active transistor die on the substrate, the active die comprising a plurality of transistor cells and at least one second conductive contact element electrically connected to one or more of the transistor cells,
wherein the at least one first conductive contact element is electrically connected to the active transistor die via the at least one second conductive contact element, and
wherein the at least one second conductive contact element comprises an input pad, an output pad, or a ground pad for the one or more of the transistor cells of the active transistor die.

42. A radio frequency (RF) integrated circuit package, comprising:
a substrate; and
a multi-level integrated device on the substrate, the multi-level integrated device comprising a first level, a second level, and a conductive contact element, wherein at least one of the first or second levels comprises a discrete electronic component that is electrically connected to the conductive contact element,
wherein the conductive contact element is electrically connected to at least one of matching circuitry, harmonic termination circuitry, an active transistor die, or a package lead, and
wherein at least one of the first level or the second level comprises a three-dimensional glass structure between the discrete electronic component and the substrate.

43. The RF integrated circuit package of claim 42, wherein the conductive contact element comprises a contact pad on a surface of the three-dimensional glass structure, a conductive through via extending through the three-dimensional glass structure, and/or a conductive edge plate extending along an edge of the three-dimensional glass structure.

* * * * *

UNITED STATES PATENT AND TRADEMARK OFFICE
CERTIFICATE OF CORRECTION

PATENT NO. : 12,074,123 B2
APPLICATION NO. : 17/031745
DATED : August 27, 2024
INVENTOR(S) : Wilson et al.

Page 1 of 1

It is certified that error appears in the above-identified patent and that said Letters Patent is hereby corrected as shown below:

In the Specification

Column 15, Line 29: Please correct "II-IF" to read --II-II'--

In the Claims

Column 27, Line 4, Claim 23: Please correct "claim 13" to read --claim 14--

Column 28, Lines 4-6, Claim 28: Please correct "and defining a portion of the at least one discrete electronic component." to read --and configured to affect an electrical characteristic of the at least one discrete electronic component.--

Signed and Sealed this
Nineteenth Day of August, 2025

Coke Morgan Stewart
*Acting Director of the United States Patent and Trademark Office*